(12) United States Patent
Lu et al.

(10) Patent No.: US 10,553,747 B2
(45) Date of Patent: *Feb. 4, 2020

(54) METHOD OF SELECTIVELY TRANSFERRING SEMICONDUCTOR DEVICE

(71) Applicant: EPISTAR CORPORATION, Hsinchu (TW)

(72) Inventors: Chih-Chiang Lu, Hsinchu (TW); Yi-Ming Chen, Hsinchu (TW); Chun-Yu Lin, Hsinchu (TW); Ching-Pei Lin, Hsinchu (TW); Chung-Hsun Chien, Hsinchu (TW); Chien-Fu Huang, Hsinchu (TW); Hao-Min Ku, Hsinchu (TW); Min-Hsun Hsieh, Hsinchu (TW); Tzu-Chieh Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 218 days.

This patent is subject to a terminal disclaimer.

(21) Appl. No.: 15/295,226

(22) Filed: Oct. 17, 2016

(65) Prior Publication Data
US 2017/0033259 A1  Feb. 2, 2017

Related U.S. Application Data

(63) Continuation of application No. 14/908,886, filed as application No. PCT/CN2013/080335 on Jul. 29, 2013, now Pat. No. 9,508,894.

(51) Int. Cl.
*H01L 33/62* (2010.01)
*H01L 21/683* (2006.01)
*H01L 33/00* (2010.01)

(52) U.S. Cl.
CPC ...... *H01L 33/0079* (2013.01); *H01L 21/6835* (2013.01); *H01L 21/6836* (2013.01);
(Continued)

(58) Field of Classification Search
None
See application file for complete search history.

(56) References Cited

U.S. PATENT DOCUMENTS 5,073,230 A    12/1991  Maracas
9,508,894 B2 * 11/2016  Lu ................ H01L 33/0079
(Continued)

FOREIGN PATENT DOCUMENTS

CN    101262118 A    9/2008
CN    103038902 A    4/2013
(Continued)

*Primary Examiner* — Alexander G Ghyka
(74) *Attorney, Agent, or Firm* — Muncy, Geissler, Olds & Lowe, P.C.

(57) ABSTRACT

A semiconductor device comprises a substrate, a first semiconductor unit on the substrate, and an first adhesion structure between the substrate and the first semiconductor unit, and directly contacting the first semiconductor unit and the substrate, wherein the first adhesion structure comprises an adhesion layer and a sacrificial layer, and the adhesion layer and the sacrificial layer are made of different materials, and wherein an adhesion between the first semiconductor unit and the adhesion layer is different from that between the first semiconductor unit and the sacrificial layer.

19 Claims, 23 Drawing Sheets

(52) U.S. Cl.
CPC .......... *H01L 33/0095* (2013.01); *H01L 33/62* (2013.01); *H01L 2221/68318* (2013.01); *H01L 2221/68363* (2013.01); *H01L 2221/68381* (2013.01); *H01L 2933/0066* (2013.01)

(56) References Cited

U.S. PATENT DOCUMENTS

| | | |
|---|---|---|
| 2007/0111473 A1 | 5/2007 | Furukawa |
| 2009/0239354 A1 | 9/2009 | Suzawa |
| 2010/0330506 A1 | 12/2010 | Knechtel |
| 2011/0294281 A1* | 12/2011 | Zang .................. H01L 21/0237 438/478 |
| 2012/0034422 A1* | 2/2012 | Fairbank ................ B82Y 30/00 428/138 |
| 2012/0055532 A1 | 3/2012 | Wang et al. |
| 2012/0171866 A1* | 7/2012 | Yonehara .................. B41J 2/45 438/694 |
| 2013/0020681 A1 | 1/2013 | Furukawa |
| 2014/0342479 A1 | 11/2014 | Marchena |
| 2015/0083202 A1 | 3/2015 | Ghyselen |
| 2015/0177458 A1 | 6/2015 | Bowers |
| 2016/0155894 A1 | 6/2016 | Huang |

FOREIGN PATENT DOCUMENTS

| | | |
|---|---|---|
| JP | 4288947 B2 | 7/2009 |
| KR | 20060049302 A | 5/2006 |
| KR | 10-20120025433 | 3/2012 |
| KR | 10-20120057654 | 6/2012 |
| TW | 200739759 A | 10/2007 |
| TW | 201212279 A | 3/2012 |
| TW | 201232811 | 8/2012 |

\* cited by examiner

US 10,553,747 B2

METHOD OF SELECTIVELY TRANSFERRING SEMICONDUCTOR DEVICE

RELATED APPLICATION DATA

This present application is a continuation application of U.S. patent application Ser. No. 14/908,886, filed Jan. 29, 2016, which is national stage entry according to 35 U.S.C. § 371 of PCT Application No. PCT/CN2013/080335, Publication No. 2015/013864, filed on Jul. 29, 2013, and is incorporated herein by reference in its entirety.

TECHNICAL FIELD

The application is related to a method of manufacturing a optoelectronic semiconductor device.

DESCRIPTION OF BACKGROUND ART

As technology developed, optoelectronic semiconductor devices have contributed a lot to energy transmission and conversion. For example, optoelectronic semiconductor devices can be used in system operation such as optical fiber communication system, optical storage system, and military system. According to the energy conversion mode, optoelectronic semiconductor devices can be classified as three categories: conversion from electrical power to light such as light-emitting diode and laser diode; conversion from light to electrical signal such as optical detector; and conversion from light into electrical power such as solar cell.

Growth substrate is important for forming an optoelectronic semiconductor device. Semiconductor epitaxial structure of the optoelectronic semiconductor device is formed on and supported by the growth substrate. Therefore, the quality of the optoelectronic semiconductor device is determined by a suitable growth substrate.

However, a suitable growth substrate sometimes is not suited to be a support substrate for the optoelectronic semiconductor device. For example, in order to obtain a high-quality semiconductor epitaxial structure for a light-emitting diode that can emit red light, the opaque GaAs substrate is usually preferred as the growth substrate for its lattice constant is the most close to that of the semiconductor epitaxial structure for red light-emitting diode. But, as the light-emitting diode is used for emitting light, the opaque growth substrate blocks the light and therefore decreases the light-emitting efficiency of the light-emitting diode in operation.

In order to satisfy the different conditions of the growth substrate and the support substrate required for different optoelectronic semiconductor devices, the technique of transferring substrate is developed. To be more specific, the semiconductor epitaxial structure is firstly formed on the growth substrate and then the semiconductor epitaxial structure is transferred to the support substrate. After the support substrate is bonded with the semiconductor epitaxial structure, the removal of the growth substrate is the key technique in the process of substrate transfer.

The method of removing the growth substrate mainly comprises dissolving method such as wet etching, physical method such as polishing and cutting, or the method of forming a sacrificial layer between the semiconductor epitaxial structure and the growth substrate in advance and then removing the sacrificial layer by etching. However, both of the wet etching method and the physical method such as polishing and cutting, damage the growth substrate. Furthermore, considering the importance of the environmental protection and the energy conservation, it is wasteful if the growth substrate cannot be reused.

SUMMARY OF THE DISCLOSURE

A semiconductor device comprises a substrate, a first semiconductor unit on the substrate, and an first adhesion structure between the substrate and the first semiconductor unit, and directly contacting the first semiconductor unit and the substrate, wherein the first adhesion structure comprises an adhesion layer and a sacrificial layer, and the adhesion layer and the sacrificial layer are made of different materials, and wherein an adhesion between the first semiconductor unit and the adhesion layer is different from that between the first semiconductor unit and the sacrificial layer.

DETAILED DESCRIPTION OF PREFERRED EMBODIMENTS

First Embodiment

Figure 1A:
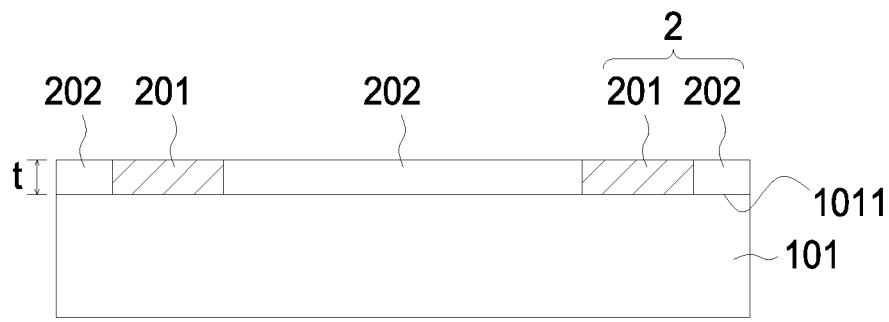
FIGS. 1A to 1I show the structures corresponding to the steps of a manufacturing process according to the first embodiment.
Figure 1B:
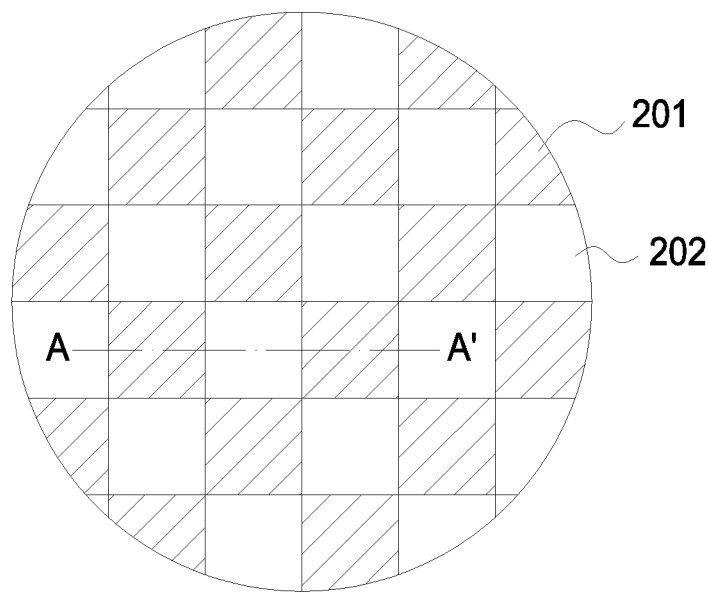

FIGS. 1A to 1I show the structures corresponding to the steps of a manufacturing process according to the first embodiment. FIG. 1A shows the cross-sectional diagram along the dotted line AA' of FIG. 1B. According to the process for manufacturing the optoelectronic device disclosed in the embodiment of the application, an adhesion substrate 101 with a surface 1011 is provided, and an adhesion structure 2 is formed on the surface 1011, wherein the adhesion structure 2 has a thickness t. In this embodiment, the thickness t is between 2 μm and 6 μm. The adhesion structure 2 comprises an adhesion layer 202 and a sacrificial layer 201, wherein the adhesion layer 202 and the sacrificial layer 201 are formed side by side on the surface 1011 and connect to the surface 1011. FIG. 1B shows the top view of the adhesion structure 2, and each of the adhesion layer 202 and the sacrificial layer 201 has a specific shape. The adhesion substrate 101 comprises an electrically-insulated substrate or an electrically-conductive substrate. The material of electrically-insulated substrate comprises sapphire, diamond, glass, quartz, acryl, $LiAlO_2$ or ceramics; the material of electrically-conductive substrate comprises semiconductor such as Si, GaAs, SiC, GaN and AlN, oxide such as ZnO, metal, or the combination thereof. In this embodiment, the materials of the adhesion layer 202 and the sacrificial layer 201 are different. The material of the adhesion layer 202 comprises BCB. The material of the sacrificial layer 201 comprises organic material or inorganic material, wherein the organic material comprises UV dissociated glue or thermoplastic material, and the inorganic material comprises metal, oxide, or nitride, wherein the UV dissociated glue comprises acrylic acid, unsaturated polyester, epoxy, oxetane or vinyl ether, the thermoplastic comprises nylon, PP, PBT, PPO, PC, ABS or PVC, the metal comprises Ti, Au, Be, W, Al or Ge, the oxide comprises $SiO_x$, and the nitride comprises $SiN_x$. In an embodiment, a thickness of the sacrificial layer 201 is between 1000 Å and 10 μm.

Figure 1C:
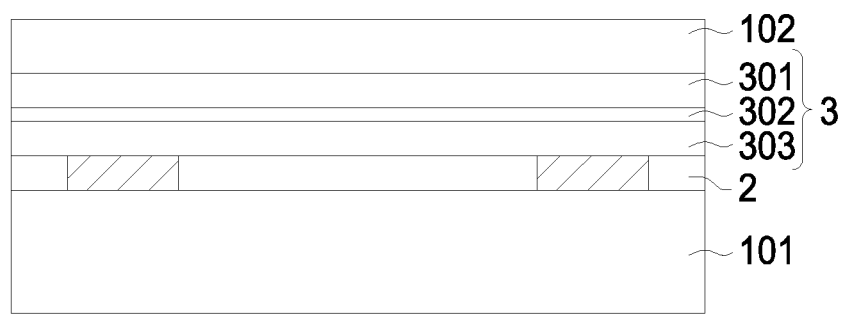

As shown in FIG. 1C, a growth substrate 102 is provided and a semiconductor epitaxial stack 3 is formed on the growth substrate 102 by epitaxial growth. Then, the growth substrate 102 and the semiconductor epitaxial stack 3 are adhered to the surface 1011 of the adhesion substrate 101 through the adhesion structure 2 by heating and pressing method, wherein both of the adhesion layer 202 and the sacrificial layer 201 contact the semiconductor epitaxial stack 3. Because the materials of the adhesion layer 202 and the sacrificial layer 201 are different, the adhesion between the adhesion layer 202 and the semiconductor epitaxial stack 3 is different from the adhesion between the sacrificial layer 201 and the semiconductor epitaxial stack 3. In this embodiment, the adhesion between the adhesion layer 202 and the semiconductor epitaxial stack 3 is larger than the adhesion between the sacrificial layer 201 and the semiconductor epitaxial stack 3.

The semiconductor epitaxial stack 3 comprises a first semiconductor layer 301 having a first type conductivity, a converting unit 302, and a second semiconductor layer 303 having a second type conductivity sequentially formed on the growth substrate 102. The first semiconductor layer 301 and the second semiconductor layer 303 both are single-layer structure or multi-layer structure (multi-layer means two or more than two layers). The first semiconductor layer 301 and the second semiconductor layer 303 have different conductive types, different electrical types and different polarities, or are doped with different elements for providing electrons or holes. When the first semiconductor layer 301 is p-type semiconductor, the second semiconductor layer 303 is n-type semiconductor, of which the electrical type is different from that of the p-type semiconductor. On the contrary, when the first semiconductor layer 301 is n-type semiconductor, the second semiconductor layer 303 is p-type semiconductor. The converting unit 302 is formed between the first semiconductor layer 301 and the second semiconductor layer 303. The converting unit 302 is able to mutually convert light into electrical power or electrical power into light. The semiconductor epitaxial stack 3 can be further adopted in a semiconductor device, equipment, product or circuit for mutually converting light into electrical power or electrical power into light. Specifically, the semiconductor epitaxial stack 3 can further form a light-emitting diode (LED), a laser diode (LD), a solar cell or be adopted in a display. Taking the light-emitting diode (LED) as an example, the wavelength of the emitted light can be adjusted by adjusting the combination of one layer or multiple layers of the semiconductor epitaxial stack 3. The material of the semiconductor epitaxial stack 3 comprises aluminum gallium indium phosphide (AlGaInP) series, aluminum gallium indium nitride (AlGaInN) series or zinc oxide (ZnO) series. The structure of the converting unit 302 comprises single heterostructure (SH), double heterostructure (DH), double-side double heterostructure (DDH) or multi-quantum well (MQW). Specifically, the converting unit 302 can be intrinsic, p-type or n-type semiconductor. When an electrical current passes through the semiconductor epitaxial stack 3, the converting unit 302 is able to emit a light. As the converting unit 302 is made of aluminum gallium indium phosphide (AlGaInP) series, the light emitted from the converting unit 302 is amber series such as red, orange and yellow. As the converting unit 302 is made of aluminum gallium indium nitride (AlGaInN) series, the light emitted from the converting unit 302 is blue or green.

Figure 1D:
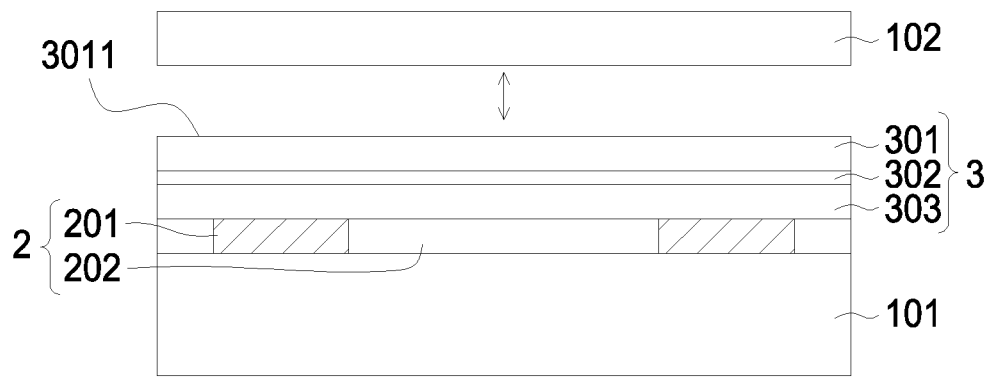

In the next step, as shown in FIG. 1D, the growth substrate 102 is separated from the semiconductor epitaxial stack 3 and a surface 3011 of the semiconductor epitaxial stack 3 is exposed. The method of separating the growth substrate 102 comprises irradiation method which uses a laser to penetrate the growth substrate 102 and to irradiate the interface between the growth substrate 102 and the semiconductor epitaxial stack 3 for separating the semiconductor epitaxial stack 3 from the growth substrate 102. In addition, wet etching method can be applied to directly remove the growth substrate 102 or remove an interlayer (not shown) between the growth substrate 102 and the semiconductor epitaxial stack 3 for separating the semiconductor epitaxial stack 3 and the growth substrate 102. Besides, the interlayer between the growth substrate 102 and the semiconductor epitaxial stack 3 can be removed by using vapor etch method in high temperature for separating the semiconductor epitaxial stack 3 and the growth substrate 102.

Figure 1E:
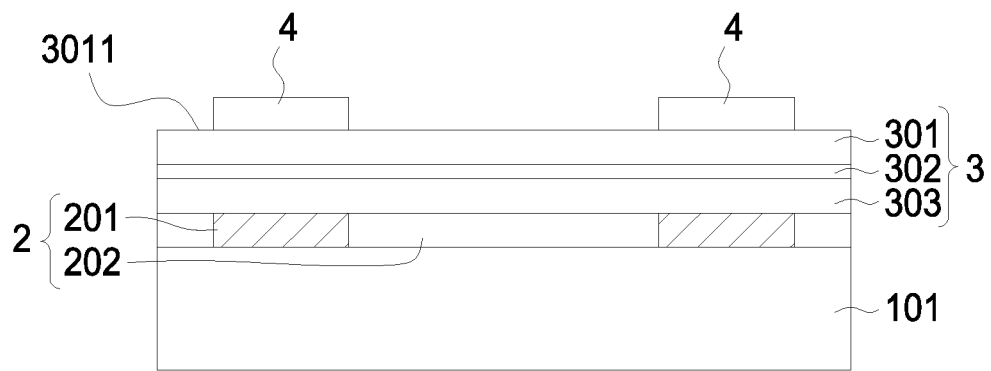

As shown in FIG. 1E, a patterned adhesion medium 4 corresponding to the sacrificial layer 201 is formed on the surface 3011 of the semiconductor epitaxial stack 3, wherein the method of forming the patterned adhesion medium 4 comprises forming a layer of adhesion medium on the surface 3011 and then using photolithography method or etching method to pattern the layer of adhesion medium to form the patterned adhesion medium 4, wherein the photolithography method and the patterned etching method are general semiconductor producing processes. The material of the patterned adhesion medium 4 comprises organic material or inorganic material, wherein the organic material comprises acrylic acid, unsaturated polyester, epoxy, oxetane, vinyl ether, nylon, PP, PBT, PPO, PC, ABS, PVC or BCB, and the inorganic material comprises metal such as Ti, Au, Be, W, Al, Ge, Cu and combination thereof, oxide such as ITO, CTO, ATO, IZO, AZO, ZTO, ZnO and $SiO_x$, or nitride such as $SiN_x$.

Figure 1F:
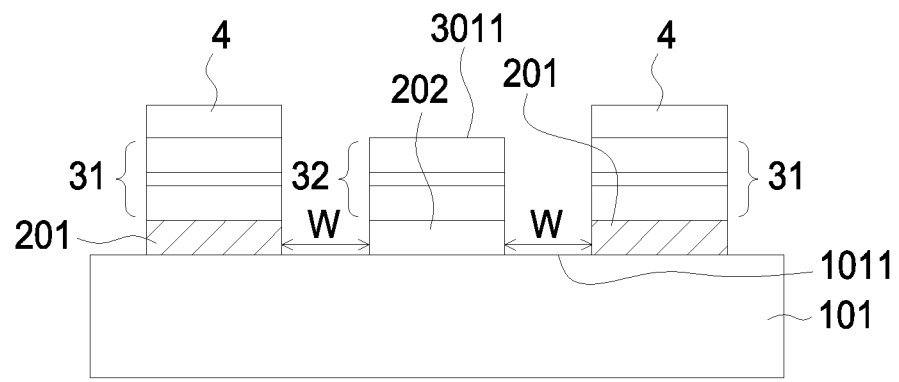

In the next step, as shown in FIG. 1F, the semiconductor epitaxial stack 3 and the adhesion structure 2 are patterned to reveal the surface 1011, so a plurality of semiconductor epitaxial stacks is formed, wherein the multiple semiconductor epitaxial stacks are separated. The multiple semiconductor epitaxial stacks comprise a first semiconductor epitaxial stack 31 and a second semiconductor epitaxial stack 32, wherein the first semiconductor epitaxial stack 31 has the adhesion medium 4 thereon and the second semiconductor epitaxial stack 32 has no the adhesion medium 4 on the surface 3011. The method of patterning the semiconductor epitaxial stack 3 and the adhesion structure 2 comprises wet etching or dry etching. In this embodiment, dry etching method is applied to make an interval w between the first semiconductor epitaxial stack 31 and the second semiconductor epitaxial stack 32 as small as possible to prevent epitaxial stack of the semiconductor epitaxial stack 3 from being removed excessively. In this embodiment, the interval w is between 1 µm and 10 µm, or preferably about 5 µm.

Figure 1G:
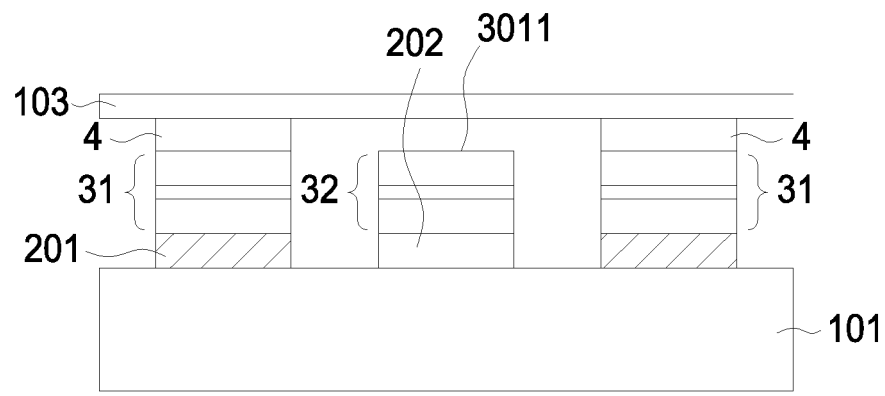
Figure 11A:
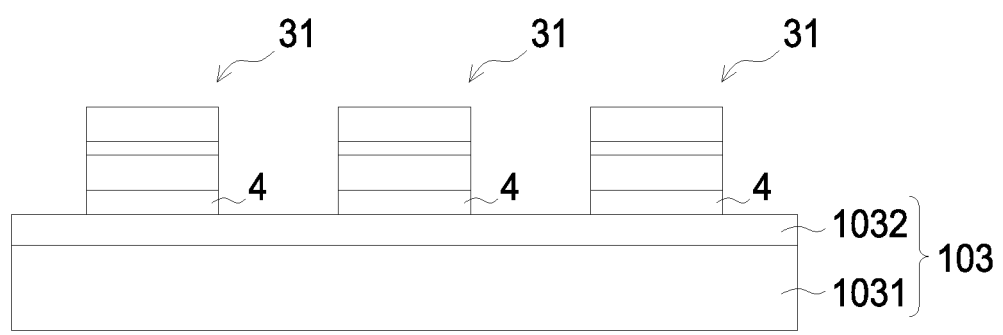
FIGS. 11A to 11B show the structures corresponding to the steps of a manufacturing process according to one embodiment.

In the next step, as shown in FIG. 1G, a picking unit 103 is provided to stick to the adhesion medium 4 by heating, pressing, or using stickiness of the picking unit 103. The picking unit 103 comprises electrically-conductive material such as electrically-conductive substrate and printed circuit board, wherein the electrically-conductive substrate comprises semiconductor such as Si, GaAs, GaN, AlN and SiC; oxide such as ZnO; metal; or the combination thereof, and the printed circuit board comprises single-sided printed circuit board, double-sided printed circuit board, multi-layer printed circuit board, or flexible printed circuit board; or electrically-insulated material such as sapphire, diamond, glass, quartz, acryl, AlN, LiAlO$_2$, ceramics and EPS tape. When the EPS tape is used as the picking unit 103, it is necessary to provide a hard substrate to stick with the EPS tape for supporting the EPS tape and preventing the EPS tape from sticking the surface 3011 of the second semiconductor epitaxial stack 32. In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN), or polyimide (PI), and the supporting structure 1031 comprises hard substrate such as sapphire, diamond, glass, quartz and acryl, for supporting the flexible substrate 1032.

In another embodiment, the patterned adhesion medium 4 is able to be formed on the picking unit 103 in advance. Then, the alignment bonding technology is applied to align the adhesion medium 4 and the first semiconductor epitaxial stack 31 firstly and then bond the adhesion medium 4 and the first semiconductor epitaxial stack 31 by heating and pressing.

Figure 1H:
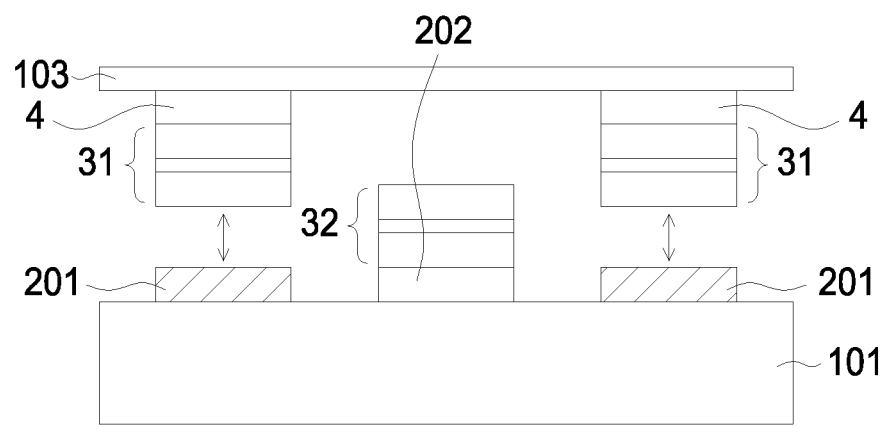

In the next step, as shown in FIG. 1H, when the adhesion between the sacrificial layer 201 and the first semiconductor epitaxial stack 31 is smaller than the adhesion between the adhesion medium 4 and the first semiconductor epitaxial stack 31, the forces in the opposite directions can be directly applied on the picking unit 103 and the adhesion substrate 101 respectively to separate the first semiconductor epitaxial stack 31 and the sacrificial layer 201 for preventing the structure of the first semiconductor epitaxial stack 31 from being damaged. In an embodiment, the adhesion between the sacrificial layer and the first semiconductor unit is able to be decreased by ultraviolet, laser or heat. For example, when the material of the sacrificial layer 201 is UV dissociated material comprising acrylic acid, unsaturated polyester, epoxy, oxetane, or vinyl ether, the stickiness of the sacrificial layer 201 can be reduced by the irradiation on the sacrificial layer 201 by UV light, and then the forces in the opposite directions are directly applied on the picking unit 103 and the adhesion substrate 101 respectively to separate the first semiconductor epitaxial stack 31 and the sacrificial layer 201. When the material of the sacrificial layer 201 is thermoplastic comprising nylon, PP, PBT, PPO, PC, ABS, or PVC, the stickiness of the sacrificial layer 201 can be reduced by heating, and then the forces in the opposite directions are directly applied on the picking unit 103 and the adhesion substrate 101 respectively to separate the first semiconductor epitaxial stack 31 and the sacrificial layer 201. When the adhesion medium 4 is made of the material with high stickiness such as BCB, and the sacrificial layer 201 is made of the material with low stickiness, the first semiconductor epitaxial stack 31 and the sacrificial layer 201 can be separated by directly applying the forces in the opposite directions on the picking unit 103 and the adhesion substrate 101 without heating or irradiating the sacrificial layer 201. The material with low stickiness comprises metal such as Ti, Al and TiW, oxide such as SiOx, or nitride such as SiNx.

Figure 1I:
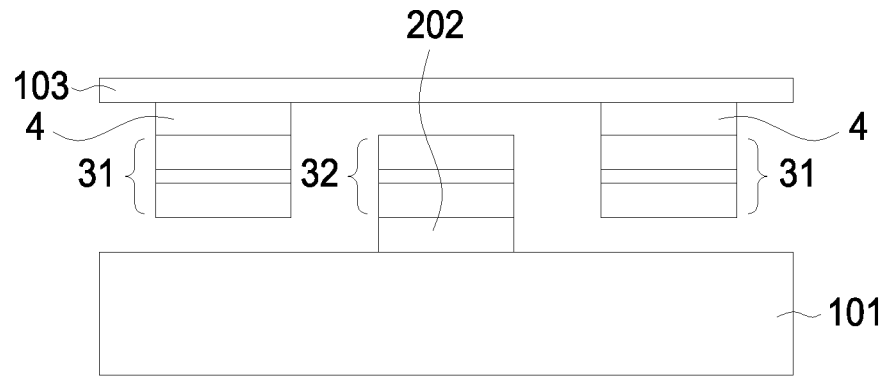

Besides, as shown in FIG. 1I, when the material of the sacrificial layer 201 comprises metal such as Ti, Al, TiW and Ag, or the material with Si such as SiOx, SiNx and poly-Si, the sacrificial layer 201 can be removed by wet etching or vapor etching, and then the forces in the opposite directions are directly applied on the picking unit 103 and the adhesion substrate 101 respectively to separate the first semiconductor epitaxial stack 31 and the sacrificial layer 201. In this embodiment, the etchant used in the wet etching process comprises hydrofluoric (HF) acid, and the chemical material used in the vapor etching process comprises hydrofluoric (HF) vapor.

Figure 11B:
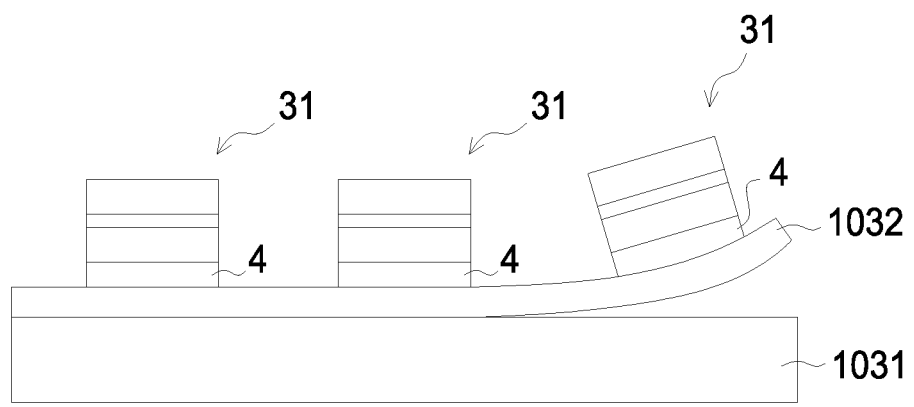

In another embodiment, as mentioned above, the picking unit 103 comprises the flexible substrate 1032 and the supporting structure 1031. After the first semiconductor epitaxial stack 31 is separated from the sacrificial layer 201, the flexible substrate 1032 and the supporting structure 1031 are able to be separated to form a flexible display as shown in FIG. 11B.

Second Embodiment

Figure 2A:
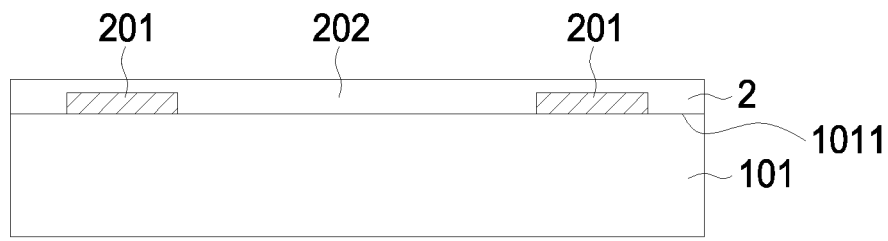
FIGS. 2A to 2H show the structures corresponding to the steps of a manufacturing process according to the second embodiment.
Figure 2B:
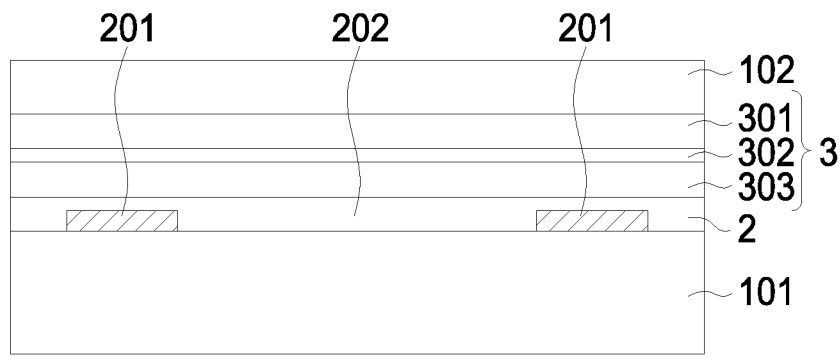
Figure 2C:
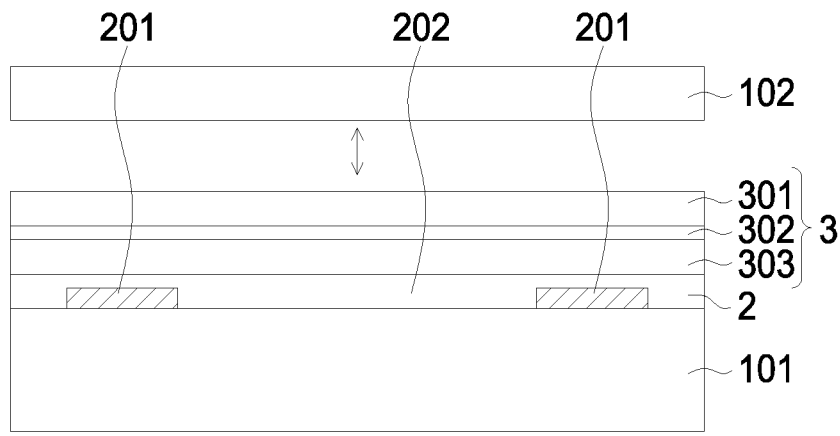
Figure 2D:
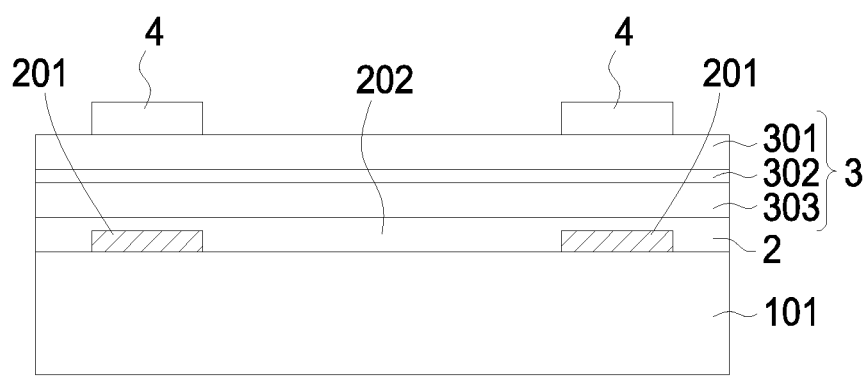
Figure 2E:
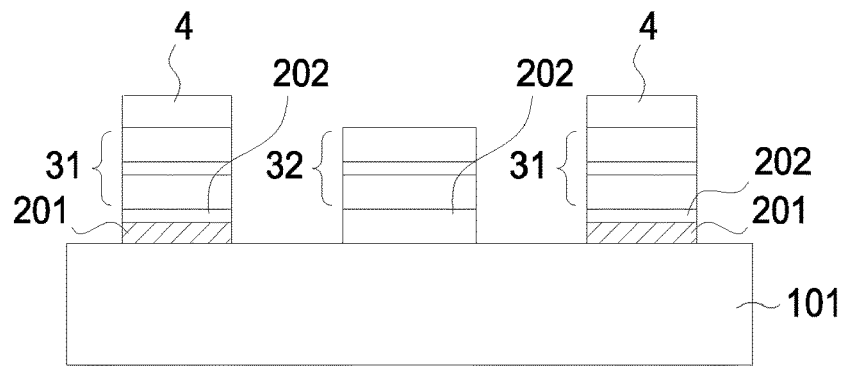
Figure 2F:
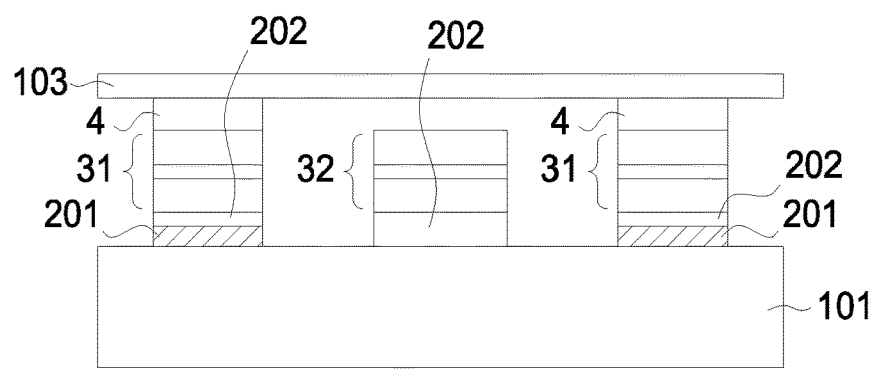
Figure 2G:
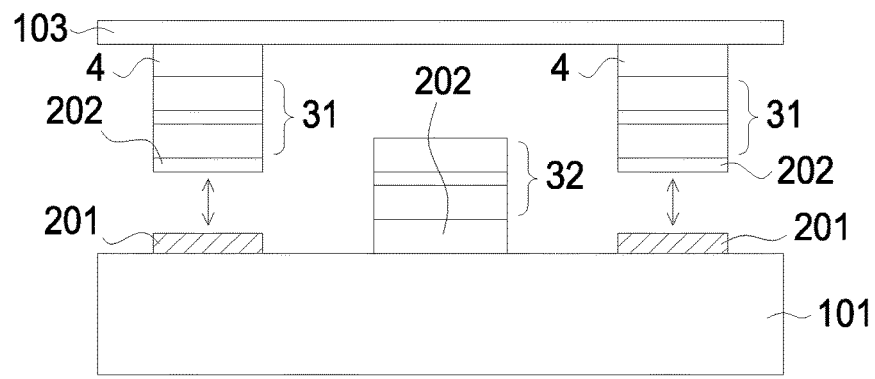
Figure 2H:
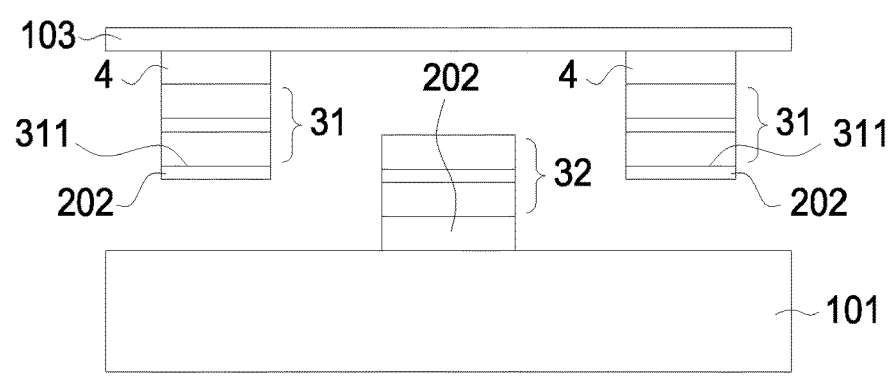

FIGS. 2A to 2H show the structures corresponding to the steps of a manufacturing process according to the second embodiment. As shown in FIG. 2A, the difference between this embodiment and the first embodiment lies in the structure of the adhesion structure 2. In this embodiment, the sacrificial layer 201 is between the surface 1011 of the adhesion substrate 101 and the adhesion layer 202. Though the other processes shown in FIGS. 2B to 2H are the same as the first embodiment, after the first semiconductor epitaxial stacks 31 are formed by the process disclosed in this embodiment, each of the first semiconductor epitaxial stacks 31 has the adhesion layer 202 on a surface 311 of each of the first semiconductor epitaxial stacks 31.

Third Embodiment

Figure 3A:
FIGS. 3A to 3H show the structures corresponding to the steps of a manufacturing process according to the third embodiment.
Figure 3B:
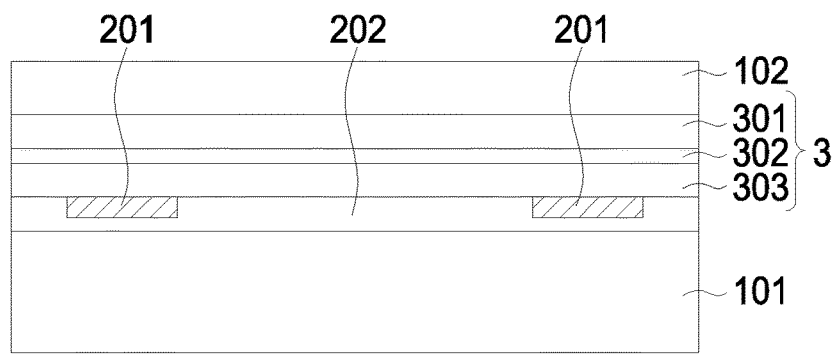
Figure 3C:
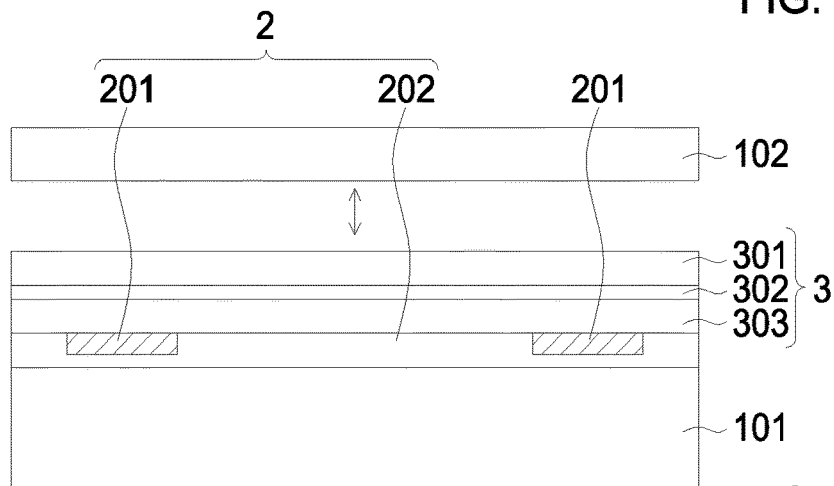
Figure 3D:
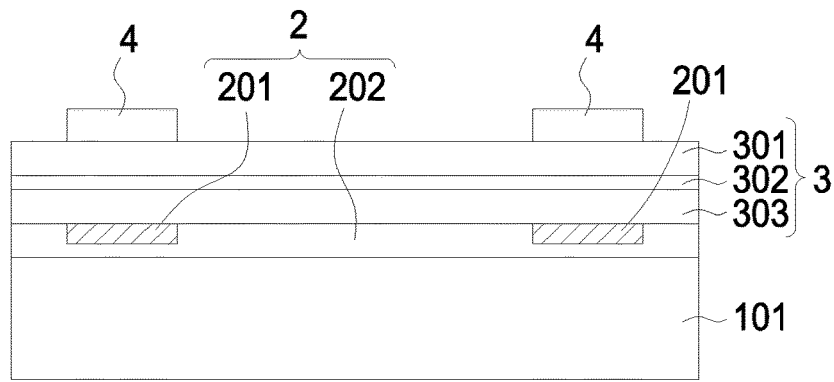
Figure 3E:
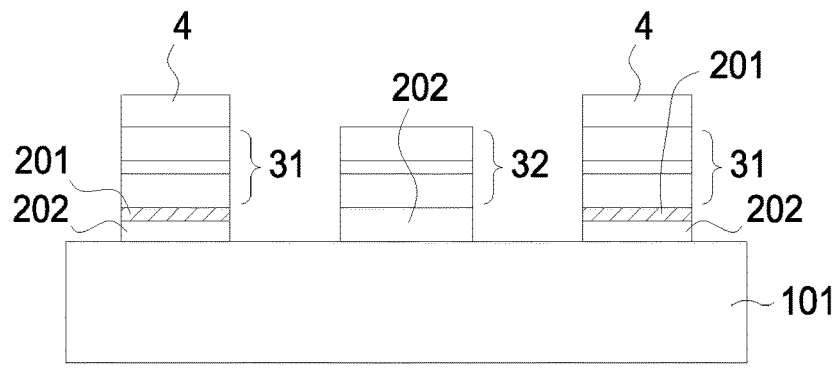
Figure 3F:
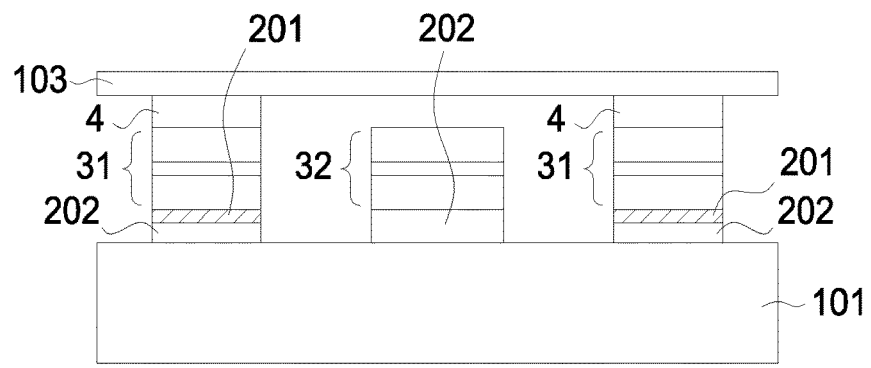
Figure 3G:
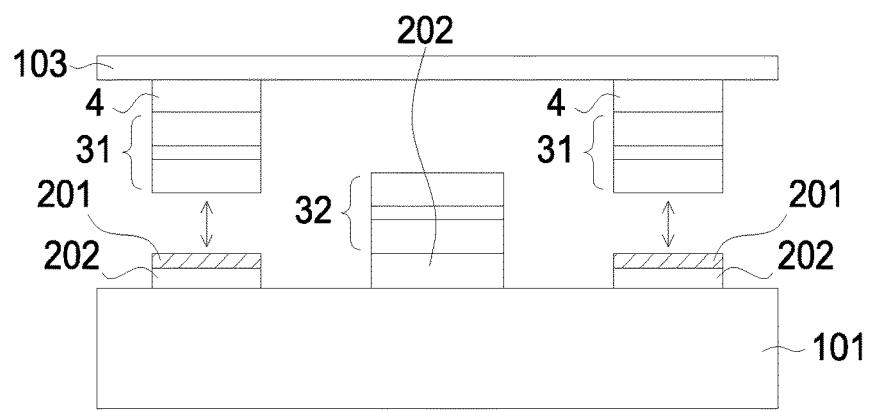
Figure 3H:
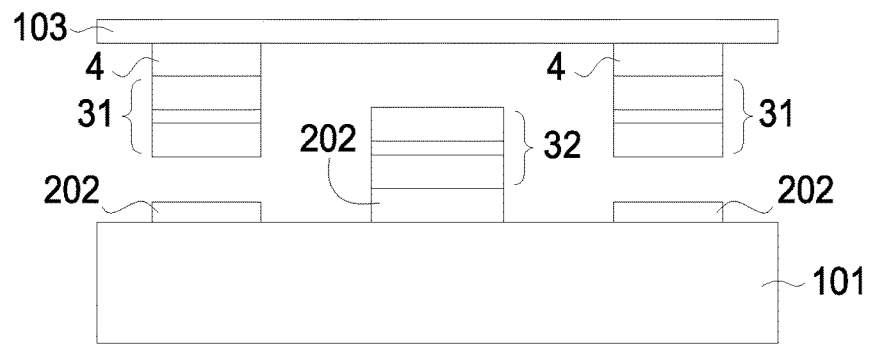

FIGS. 3A to 3H show the structures corresponding to the steps of a manufacturing process according to the third embodiment. As shown in FIG. 3A, the sacrificial layer 201 and the adhesion layer 202 are formed on the surface 311 of the semiconductor epitaxial stack 3 and the surface 1011 of the adhesion substrate 101 respectively in advance. Then, as shown in FIG. 3B, the semiconductor epitaxial stack 3 and the adhesion substrate 101 are bonded through the sacrificial layer 201 and the adhesion layer 202 by heating and pressing to form the adhesion structure 2. Because the material of the adhesion layer 202 comprises BCB, the sacrificial layer 201 extrudes the material of the adhesion layer 202 between the sacrificial layer 201 and the adhesion substrate 101 during the bonding process. Therefore, the thickness of the adhesion layer 202 between the sacrificial layer 201 and the adhesion substrate 101 is smaller than the thickness of the adhesion layer 202 between the semiconductor epitaxial stack 3 and the adhesion substrate 101. The difference between this embodiment and the first embodiment lies in the structure of the adhesion structure 2. In this embodiment, the sacrificial layer 201 is on the adhesion layer 202 and does not contact the surface 1011 of the adhesion substrate 101. The other processes shown in FIGS. 3B to 3H are the same as the first embodiment.

Fourth Embodiment

Figure 4A:
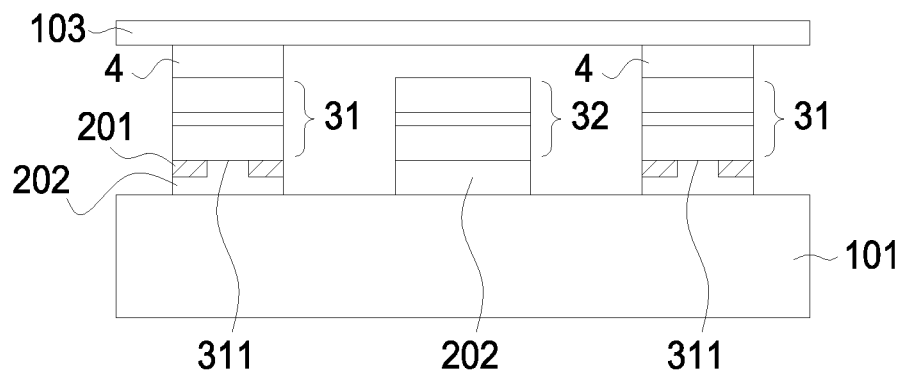
FIGS. 4A to 4C show the structures according to the fourth embodiment.
Figure 4B:
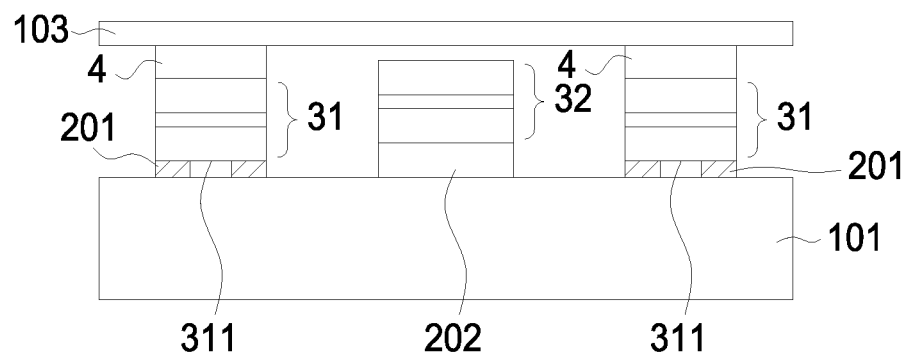
Figure 4C:
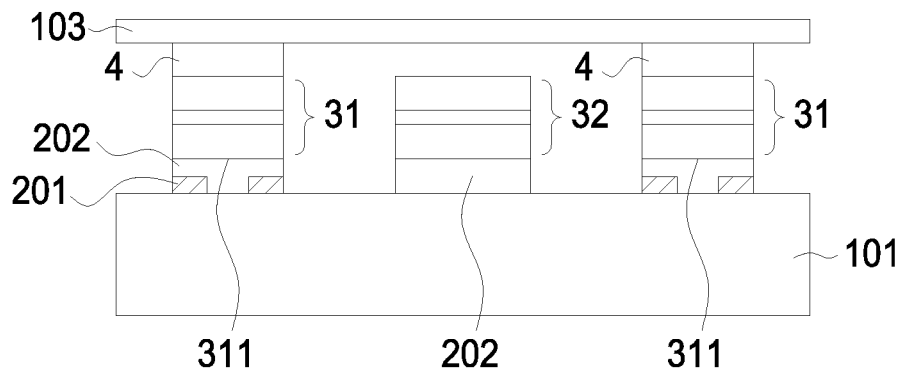

FIGS. 4A to 4C show the structures according to the fourth embodiment. As shown in FIG. 4A, the difference between this embodiment and the third embodiment is that the surface 311 of each of the first semiconductor epitaxial stacks 31 contacts the patterned sacrificial layer 201 and the adhesion layer 202. Alternatively, as shown in FIG. 4B, the difference between this embodiment and the first embodiment can be that the surface 311 of each of the first semiconductor epitaxial stacks 31 contacts the patterned sacrificial layer 201 and the adhesion layer 202. Alternatively, as shown in FIG. 4C, the difference between this embodiment and the second embodiment can be that each of the patterned sacrificial layers 201 corresponding to the first semiconductor epitaxial stacks 31 is covered by the adhesion layer 202 and adhered to the adhesion substrate 101. A growth substrate 102 is provided and a semiconductor epitaxial stack 3 is formed on the growth substrate 102 by epitaxial growth. Then, the growth substrate 102 and the semiconductor epitaxial stack 3 are adhered to the surface 1011 for being bonded with the adhesion substrate 101 through the adhesion structure 2

Fifth Embodiment

Figure 5A:
FIGS. 5A to 5G show the structures corresponding to the steps of a manufacturing process according to the fifth embodiment.

FIGS. 5A to 5G show the structures corresponding to the steps of a manufacturing process according to the fifth embodiment. As shown in FIG. 5A, according to the process for manufacturing the optoelectronic device of the application, an adhesion substrate 101 with a surface 1011 is provided, and an adhesion structure 2 is formed on the surface 1011, wherein the adhesion structure 2 has a thickness t. In this embodiment, the thickness t is between 1 μm and 10 μm, or preferably between 2 μm and 6 μm. The adhesion substrate 101 comprises an electrically insulated substrate or an electrically-conductive substrate. The material of electrically-insulated substrate comprises sapphire, diamond, glass, quartz, acryl, AlN, LiAlO$_2$ or ceramics; the material of electrically-conductive substrate comprises semiconductor such as Si, GaAs, SiC, GaN and AlN; oxide such as ZnO; metal material; or the combination thereof. The adhesion structure 2 comprises organic material or inorganic material, wherein the organic material comprises acrylic acid, Unsaturated polyester, epoxy, oxetane, vinyl ether, nylon, PP, PBT, PPO, PC, ABS, PVC or BCB; the inorganic material comprises metal such as Ti, Au, Be, W, Al, Ge, Cu and combination thereof, oxide such as ITO, CTO, ATO, IZO, AZO, ZTO, ZnO and SiO$_x$, or nitride such as SiN$_x$. The semiconductor epitaxial stack 3 comprises a first semiconductor layer 301 having a first type conductivity, a converting unit 302, and a second semiconductor layer 303 having a second type conductivity sequentially formed on the growth substrate 102. The first semiconductor layer 301 and the second semiconductor layer 303 both are single-layer structure or multi-layer structure (multi-layer means two or more than two layers). The first semiconductor layer 301 and the second semiconductor layer 303 have different conductive types, different electrical types, different polarities, or are doped with different elements for providing electrons or holes. When the first semiconductor layer 301 is p-type semiconductor, the second semiconductor layer 303 is n-type semiconductor, of which the electrical type is different from that of the p-type semiconductor. On the contrary, when the first semiconductor layer 301 is n-type semiconductor, the second semiconductor layer 303 is p-type semiconductor. The converting unit 302 is formed between the first semiconductor layer 301 and the second semiconductor layer 303. The converting unit 302 is able to mutually convert light into electrical power or electrical power into light. The semiconductor epitaxial stack 3 can further be adopted in a semiconductor device, equipment, product or circuit for mutually converting light into electrical power or electrical power into light. Specifically, the semiconductor epitaxial stack 3 can further form a light-emitting diode (LED), a laser diode (LD), a solar cell or be adopted in a display. Taking the light-emitting diode (LED) as an example, the wavelength of the light emitted can be adjusted by adjusting the combination of one layer or multiple layers of the semiconductor epitaxial stack 3. The material of the semiconductor epitaxial stack 3 comprises aluminum gallium indium phosphide (AlGaInP) series, aluminum gallium indium nitride (AlGaInN) series or zinc oxide (ZnO) series. The structure of the converting unit 302 comprises single heterostructure (SH), double heterostructure (DH), double-side double heterostructure (DDH) or multi-quantum well (MQW). Specifically, the converting unit 302 can be intrinsic, p-type, or n-type semiconductor. When an electrical current passes through the semiconductor epitaxial stack 3, the converting unit 302 is able to emit light. As the converting unit 302 is made of aluminum gallium indium phosphide (AlGaInP) series, the light emitted from the converting unit 302 is amber series such as red, orange, and yellow. As the converting unit 302 is made of aluminum gallium indium nitride (AlGaInN) series, the light emitted from the converting unit 302 is blue or green.

In another embodiment, the adhesion structure 2 is formed on a surface 3012 of the semiconductor epitaxial stack 3 in advance, and the growth substrate 102 and the semiconductor epitaxial stack 3 are adhered to the surface 1011 for being bonded with the adhesion substrate 101 through the adhesion structure 2.

Figure 5B:
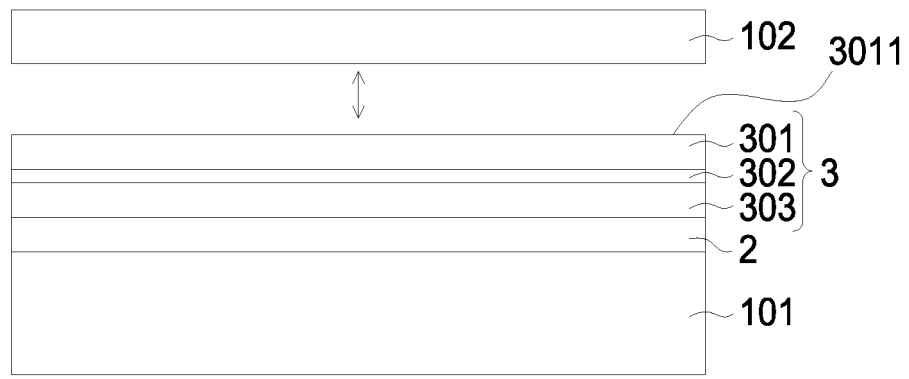

In the next step, as shown in FIG. 5B, the growth substrate 102 is separated from the semiconductor epitaxial stack 3 and a surface 3011 of the semiconductor epitaxial stack 3 is exposed. The method of separating the growth substrate 102 comprises irradiation method which uses a laser penetrating the growth substrate 102 to irradiate the interface between the growth substrate 102 and the semiconductor epitaxial stack 3 for separating the semiconductor epitaxial stack 3 and the growth substrate 102. In addition, wet etching method can be applied to directly remove the growth substrate 102 or remove an interlayer (not shown) between the growth substrate 102 and the semiconductor epitaxial stack 3 for separating the semiconductor epitaxial stack 3 and the growth substrate 102. Besides, the interlayer between the growth substrate 102 and the semiconductor epitaxial stack 3 can be removed by using vapor etch method in high temperature for separating the semiconductor epitaxial stack 3 and the growth substrate 102.

Figure 5C:
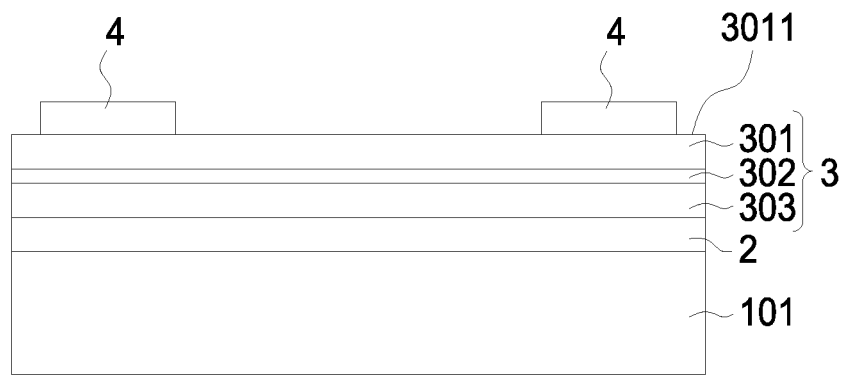

In the next step, as shown in FIG. 5C, a patterned adhesion medium 4 corresponding to the sacrificial layer 201 is formed on the surface 3011 of the semiconductor epitaxial stack 3, wherein the method of forming the patterned adhesion medium 4 comprises forming a layer of adhesion medium layer on the surface 3011 and, then, using photolithography method or etching method to pattern the layer of adhesion medium layer to form the patterned adhesion medium 4, wherein the photolithography method and the patterned etching method are generally semiconductor producing processes. The material of the patterned adhesion medium 4 comprises organic material or inorganic material, wherein the organic material comprises acrylic acid, unsaturated polyester, epoxy, oxetane, vinyl ether, nylon, PP, PBT, PPO, PC, ABS, PVC or BCB, and the inorganic material comprises metal such as Ti, Au, Be, W, Al, Ge, Cu and combination thereof, oxide such as ITO, CTO, ATO, IZO, AZO, ZTO, ZnO and $SiO_x$, or nitride such as $SiN_x$.

Figure 5D:
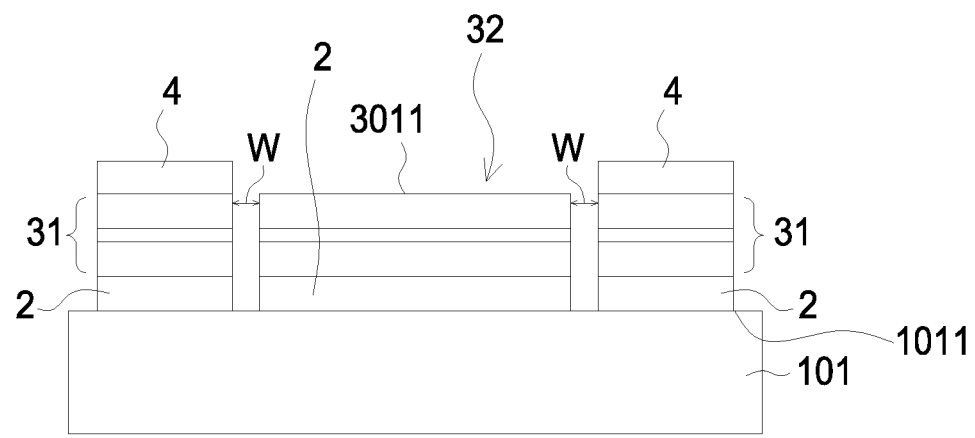
Figure 5E:
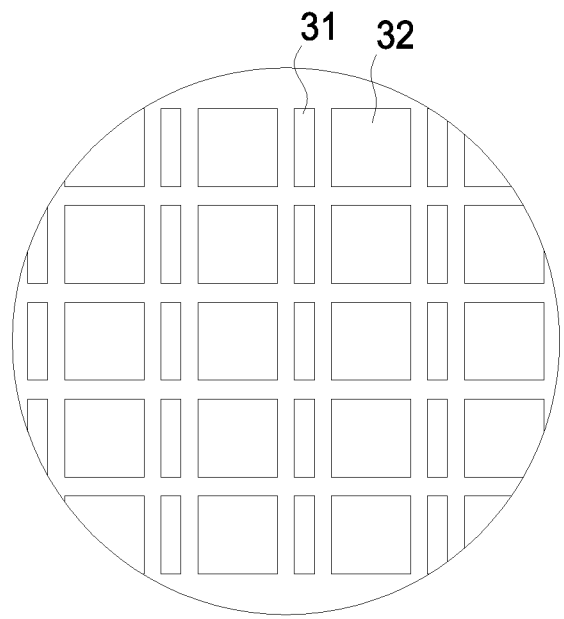

In the next step, as shown in FIG. 5D, the semiconductor epitaxial stack 3 and the adhesion structure 2 are patterned to reveal the surface 1011 so a plurality of semiconductor epitaxial stacks is formed, wherein the multiple semiconductor epitaxial stacks are separated. The multiple semiconductor epitaxial stacks comprise a first semiconductor epitaxial stack 31 and a second semiconductor epitaxial stack 32. FIG. 5E shows the top-view of the first semiconductor epitaxial stacks 31 and the second semiconductor epitaxial stacks 32 in FIG. 5D. In this embodiment, the area of the first semiconductor epitaxial stack 31 is smaller than the area of the second semiconductor epitaxial stacks 32. And, each of the first semiconductor epitaxial stacks 31 has the adhesion medium 4 thereon, and the second semiconductor epitaxial stack 32 has no the adhesion medium 4 on the surface 3011. The method of patterning the semiconductor epitaxial stack 3 and the adhesion structure 2 comprises wet etching or dry etching. In this embodiment, dry etching method is applied to make an interval w between the first semiconductor epitaxial stack 31 and the second semiconductor epitaxial stack 32 as small as possible to prevent epitaxial stack of the semiconductor epitaxial stack 3 from being removed excessively. In this embodiment, the interval w is between 1 μm and 10 μm, or preferably about 5 μm.

Figure 5F:
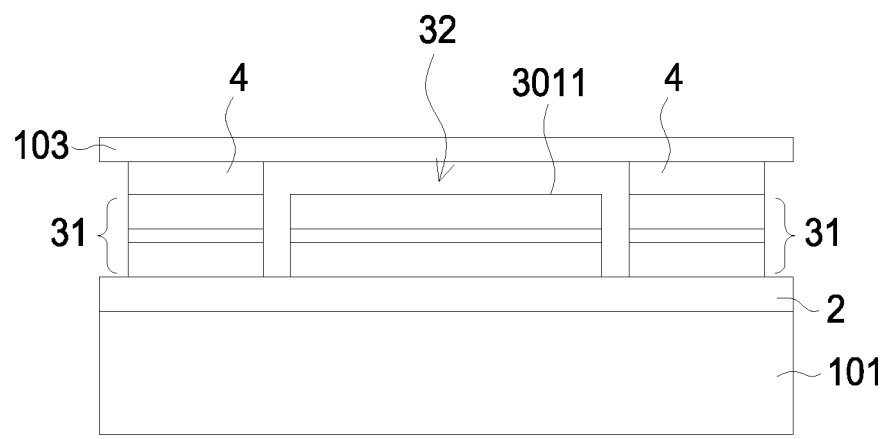

In the next step, as shown in FIG. 5F, a picking unit 103 is provided to stick the adhesion medium 4 by heating, pressing, or using the stickiness of the picking unit 103. The picking unit 103 comprises electrically-conductive material, such as electrically-conductive substrate and printed circuit board, wherein the electrically-conductive substrate comprises semiconductor such as Si, GaAs, SiC, GaN, and AlN; oxide such as ZnO; metal or the combination thereof, and the printed circuit board comprises single-sided printed circuit board, double-sided printed circuit board, multi-layers printed circuit board, or flexible printed circuit board; or electrically-insulated material such as sapphire, diamond, glass, quartz, acryl, $LiAlO_2$, ceramics substrate and EPS tape. When the EPS tape is used as the picking unit 103, it is necessary to provide a hard substrate to stick the EPS tape for supporting the EPS tape and for preventing the EPS tape from sticking the surface 3011 of the second semiconductor epitaxial stack 32. In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN), or polyimide (PI), and the supporting structure 1031 comprises hard substrate such as sapphire, diamond, glass, quartz and acryl, for supporting the flexible substrate 1032.

In another embodiment, the patterned adhesion medium 4 is able to be formed on the picking unit 103 in advance. Then, the alignment bonding technology is applied to align the adhesion medium 4 and the first semiconductor epitaxial stack 31 firstly and to bond the adhesion medium 4 and the first semiconductor epitaxial stack 31 by heating and pressing for forming the structure shown in FIG. 5F.

Figure 5G:
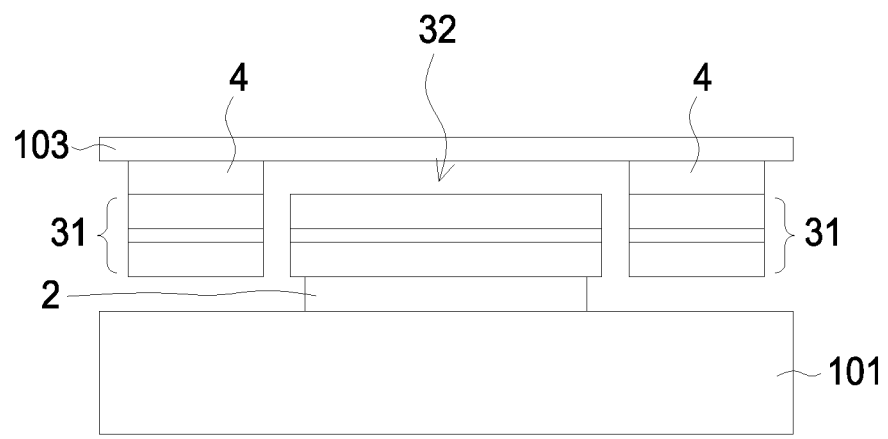

In the next step, as shown in FIG. 5G, the adhesion structure 2 is etched by using wet etching or vapor etching. The etching time of the wet etching or the vapor etching is limited to make the first semiconductor epitaxial stack 31 being totally separated from the adhesion substrate 101 and a portion of the adhesion structure 2 remaining between the second semiconductor epitaxial stack 32 and adhesion substrate 101 to support the second semiconductor epitaxial stack 32.

In another embodiment, as mentioned above, the picking unit 103 comprises the flexible substrate 1032 and the supporting structure 1031. After the first semiconductor epitaxial stack 31 is separated from the sacrificial layer 201, the flexible substrate 1032 and the supporting structure 1031 are able to be separated to form a flexible display, as shown in FIG. 11B.

Sixth Embodiment

Figure 6A:
FIGS. 6A to 6H show the structures corresponding to the steps of a manufacturing process according to the sixth embodiment.
Figure 6B:
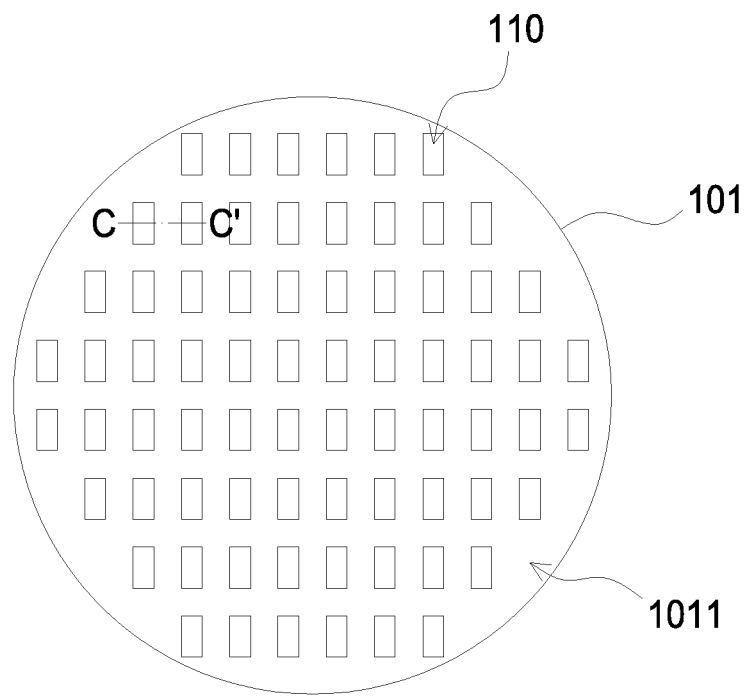

FIGS. 6A to 6H show the structures corresponding to the steps of a manufacturing process according to the sixth embodiment. As shown in FIG. 6A, according to the process for manufacturing the optoelectronic device of the application, an adhesion substrate 101 is provided and the adhesion substrate 101 has a surface 1011 and a surface 1012 opposite to the surface 1011. The adhesion substrate 101 has a hole 110 passing from the surface 1011 to the surface 1012. FIG. 6B shows the top-view of the adhesion substrate 101, wherein FIG. 6A shows the cross-sectional diagram along the dotted line CC' of FIG. 6B. The adhesion substrate 101 comprises an electrically-insulated substrate or an electrically-conductive substrate. The material of electrically-insulated substrate comprises sapphire, diamond, glass, quartz, acryl, $LiAlO_2$, or ceramics; the material of electrically-conductive substrate comprises semiconductor such as Si, GaAs, SiC, GaN, AlN; oxide such as ZnO; metal material or the combination thereof.

Figure 6C:
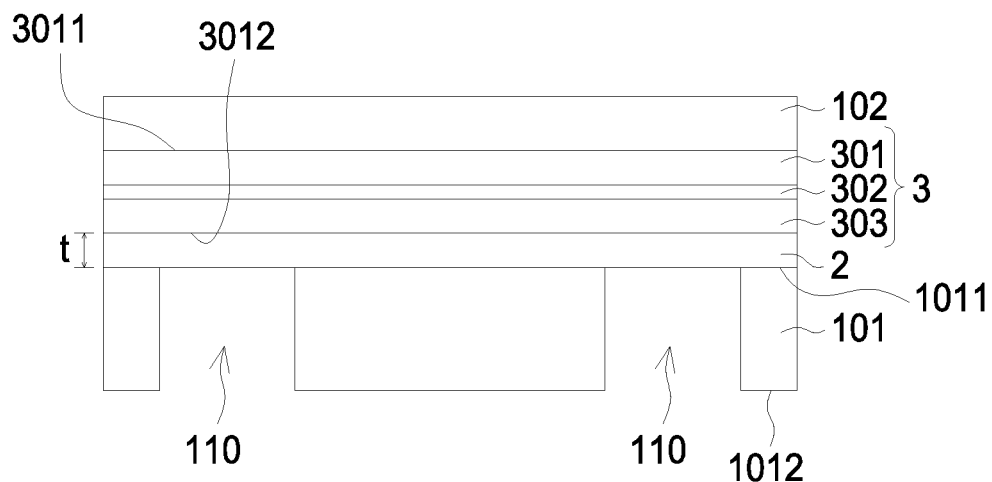

In the next step, as shown in FIG. 6C, a growth substrate 102 is provided and a semiconductor epitaxial stack 3 is formed on the growth substrate 102 by epitaxial growth. Then, the growth substrate 102 and the semiconductor epitaxial stack 3 are adhered to the surface 1011 for being bonded with the adhesion substrate 101 through the adhesion structure 2, wherein the holes 110 reveal a portion of the adhesion structure 2. In this embodiment, the adhesion structure 2 can be formed on the surface 3012 of the semiconductor epitaxial stack 3 in advance, and then, the growth substrate 102 and the semiconductor epitaxial stack 3 are adhered to the surface 1011 for being bonded with the adhesion substrate 101 through the adhesion structure 2.

The adhesion structure 2 has a thickness t between 1 μm and 10 μm, or preferably between 2 μm and 6 μm. The adhesion structure 2 comprises organic material or inorganic material, wherein the organic material comprises acrylic acid, unsaturated polyester, epoxy, oxetane, vinyl ether, nylon, PP, PBT, PPO, PC, ABS, PVC, or BCB, and the inorganic material comprises metal such as Ti, Au, Be, W, Al, Ge, Cu and combination thereof; oxide such as ITO, CTO, ATO, IZO, AZO, ZTO, ZnO and $SiO_x$; or nitride such as $SiN_x$. The semiconductor epitaxial stack 3 comprises a first semiconductor layer 301 having a first type conductivity, a converting unit 302, and a second semiconductor layer 303 having a second type conductivity sequentially formed on the growth substrate 102. The first semiconductor layer 301 and the second semiconductor layer 303 both are single-layer structure or multi-layer structure (multi-layer means two or more than two layers). The first semiconductor layer 301 and the second semiconductor layer 303 have different conductive types, different electrical types, and different polarities, or are doped with different elements for providing electrons or holes. When the first semiconductor layer 301 is p-type semiconductor, the second semiconductor layer 303 is n-type semiconductor, of which the electrical type is different from that of the p-type semiconductor. On the contrary, when the first semiconductor layer 301 is n-type semiconductor, the second semiconductor layer 303 is p-type semiconductor. The converting unit 302 is formed between the first semiconductor layer 301 and the second semiconductor layer 303. The converting unit 302 is able to convert light into electrical power or electrical power into light mutually. The semiconductor epitaxial stack 3 can be further adopted in a semiconductor device, equipment, product or circuit for mutually converting light into electrical power or electrical power into light. Specifically, the semiconductor epitaxial stack 3 can further form a light-emitting diode (LED), a laser diode (LD), a solar cell or be adopted in a display. Taking the light-emitting diode (LED) as an example, the wavelength of the light emitted can be adjusted by adjusting the combination of one layer or multiple layers of the semiconductor epitaxial stack 3. The material of the semiconductor epitaxial stack 3 comprises aluminum gallium indium phosphide (AlGaInP) series, aluminum gallium indium nitride (AlGaInN) series, or zinc oxide (ZnO) series. The structure of the converting unit 302 comprises single heterostructure (SH), double heterostructure (DH), double-side double heterostructure (DDH) or multi-quantum well (MQW). Specifically, the converting unit 302 can be intrinsic, p-type, or n-type semiconductor. When an electrical current passes through the semiconductor epitaxial stack 3, the converting unit 302 is able to emit a light. As the converting unit 302 is made of aluminum gallium indium phosphide (AlGaInP) series, the light emitted from the converting unit 302 is amber series, such as red, orange and yellow. As the converting unit 302 is made of aluminum gallium indium nitride (AlGaInN) series, the light emitted from the converting unit 302 is blue or green.

Figure 6D:
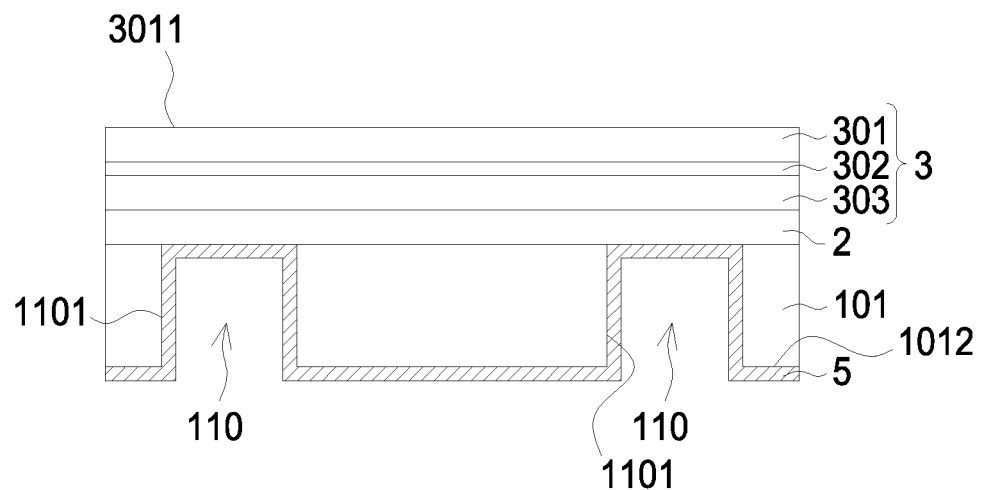

In the next step, as shown in FIG. 6D, the growth substrate 102 is separated from the semiconductor epitaxial stack 3 for revealing a surface 3011 of the semiconductor epitaxial stack 3, and a support structure 5 is formed on and conformally covers the surface 1012 of the adhesion substrate 101, a wall surface 1101 of the holes 110 and a portion of the adhesion structure 2 exposed from the holes 110. In the embodiment, the method of separating the growth substrate 102 comprises the methods mentioned in the first embodiment. The material of the support structure 5 comprises organic material or inorganic material, wherein the organic material comprises UV dissociated glue or thermoplastic, and the inorganic material, comprises metal, oxide or nitride, wherein UV dissociated glue comprises acrylic acid, unsaturated polyester, epoxy, oxetane or vinyl ether, the thermoplastic comprises Nylon, PP, PBT, PPO, PC, ABS or PVC, the metal comprises Ti, Au, Be, W, Al or Ge, the oxide comprises $SiO_x$, and the nitride comprises $SiNx$.

Figure 6E:
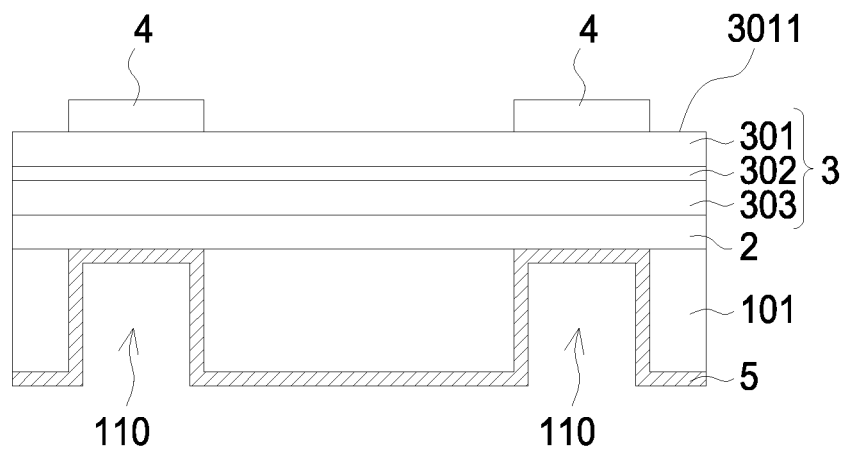

In the next step, as shown in the FIG. 6E, a patterned adhesion medium 4 corresponding to the holes 110 is formed on the surface 3011 of the semiconductor epitaxial stack 3, wherein the method of forming the patterned adhesion medium 4 comprises forming a layer of adhesion medium layer on the surface 3011 and then, using photolithography method or etching method to pattern the layer of adhesion medium layer to form the patterned adhesion medium 4, wherein the photolithography method and the patterned etching method are generally semiconductor producing processes. The material of the patterned adhesion medium 4 comprises organic material or inorganic material, wherein the organic material comprises acrylic acid, unsaturated polyester, epoxy, oxetane, vinyl ether, nylon, PP, PBT, PPO, PC, ABS, PVC or BCB, and the inorganic material comprises metal such as Ti, Au, Be, W, Al, Ge, Cu and combination thereof, oxide such as ITO, CTO, ATO, IZO, AZO, ZTO, ZnO and $SiO_x$, or nitride such as $SiN_x$.

Figure 6F:
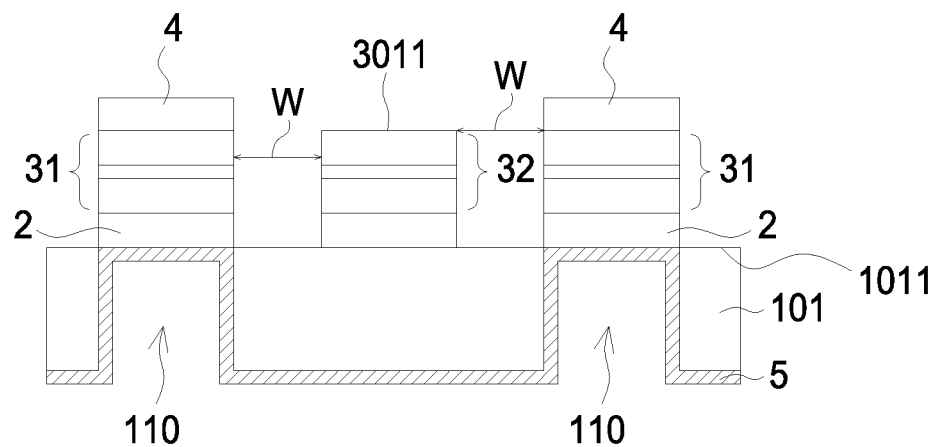

In the next step, as shown in FIG. 6F, the semiconductor epitaxial stack 3 and the adhesion structure 2 are patterned to reveal the surface 1011, so a plurality of semiconductor epitaxial stacks is formed, wherein the multiple semiconductor epitaxial stacks are separated. The multiple semiconductor epitaxial stacks comprise a first semiconductor epitaxial stack 31 and a second semiconductor epitaxial stack 32, wherein the first semiconductor epitaxial stack 31 has the adhesion medium 4 thereon and the second semiconductor epitaxial stack 32 has no the adhesion medium 4 on the surface 3011. The method of patterning the semiconductor epitaxial stack 3 and the adhesion structure 2 comprises wet etching or dry etching. In this embodiment, dry etching method is applied to make an interval w between the first semiconductor epitaxial stack 31 and the second semiconductor epitaxial stack 32 as small as possible to prevent epitaxial stack of the semiconductor epitaxial stack 3 from being removed excessively. In this embodiment, the interval w is between 1 μm and 10 μm, or preferably about 5 μm.

Figure 6G:
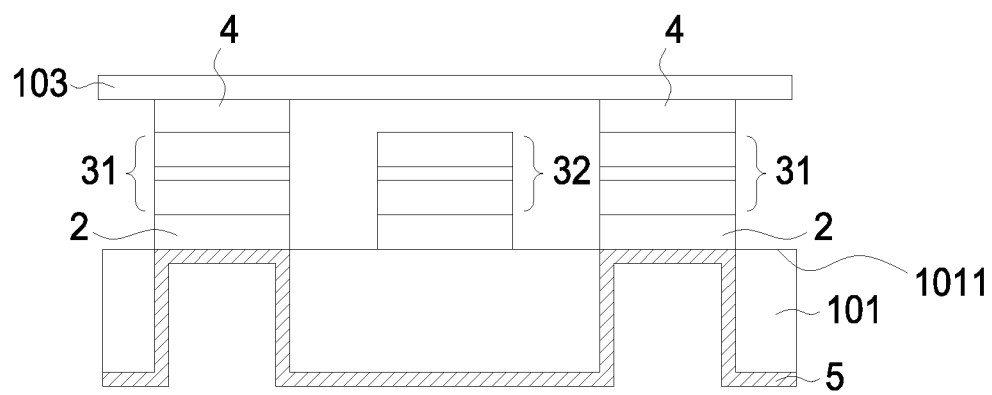

In the next step, as shown in FIG. 6G, a picking unit 103 is provided to stick the adhesion medium 4 by heating, pressing, or using stickiness of the picking unit 103. The picking unit 103 comprises electrically-conductive material, such as electrically-conductive substrate and printed circuit board, wherein the electrically-conductive substrate comprises semiconductor such as Si, GaAs, SiC, GaN, AlN; oxide such as ZnO; metal or the combination thereof, and the printed circuit board comprises single-sided printed circuit board, double-sided printed circuit board, multi-layers printed circuit board or flexible printed circuit board; or electrically-insulated material, such as sapphire, diamond, glass, quartz, acryl, $LiAlO_2$, ceramics and EPS tape. When the EPS tape is used as the picking unit 103, it is necessary to provide a hard substrate to stick the EPS tape for supporting the EPS tape and for preventing the EPS tape from sticking the surface 3011 of the second semiconductor epitaxial stack 32.

In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN) or polyimide (PI), and the supporting structure 1031 comprises hard substrate such as sapphire, diamond, glass, quartz and acryl, for supporting the flexible substrate 1032.

In another embodiment, the patterned adhesion medium 4 is able to be formed on the picking unit 103 in advance. Then, the alignment bonding technology is applied to align the adhesion medium 4 and the first semiconductor epitaxial stack 31 firstly and, then, bond the adhesion medium 4 and the first semiconductor epitaxial stack 31 by heating and pressing.

Figure 6H:
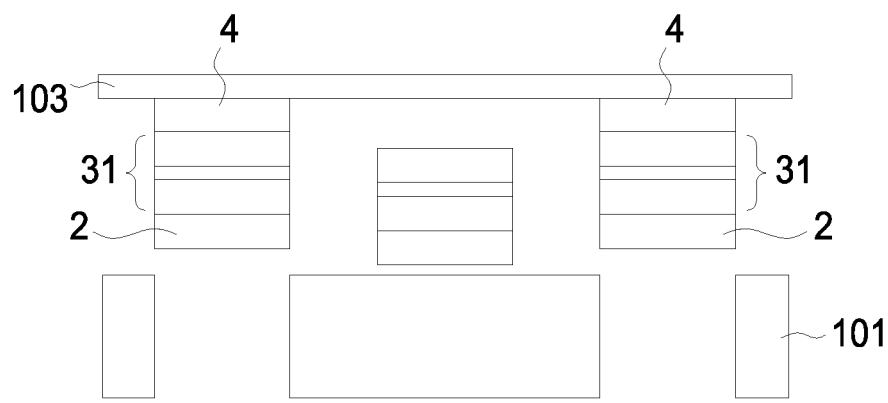
Figure 7A:
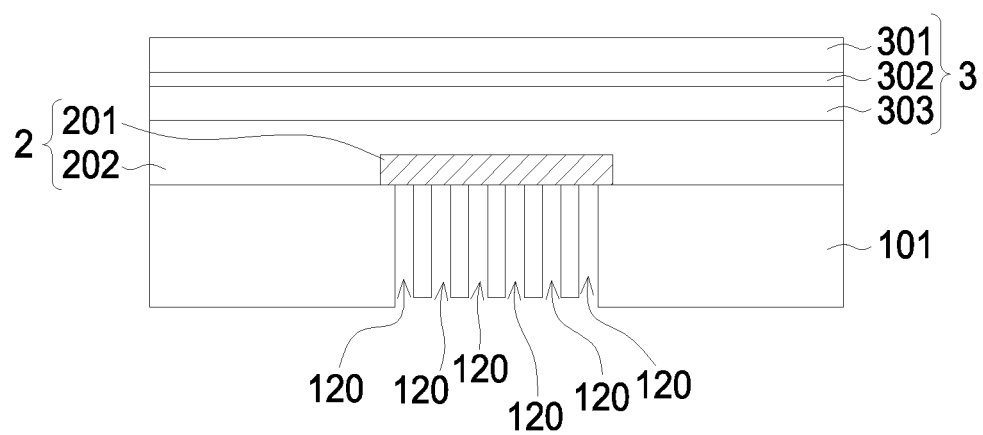
FIGS. 7A to 7F show the structures corresponding to the steps of a manufacturing process according to the seventh embodiment.
Figure 7B:
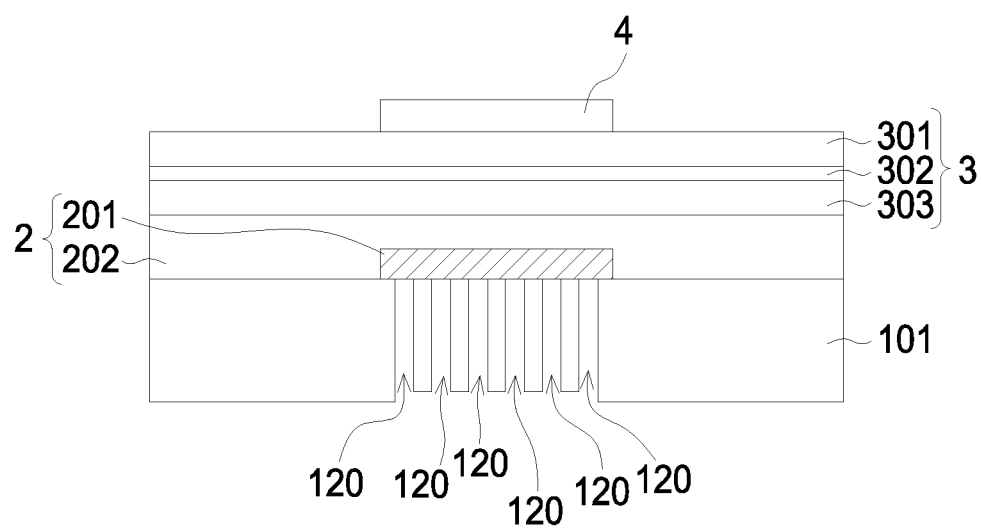
Figure 7C:
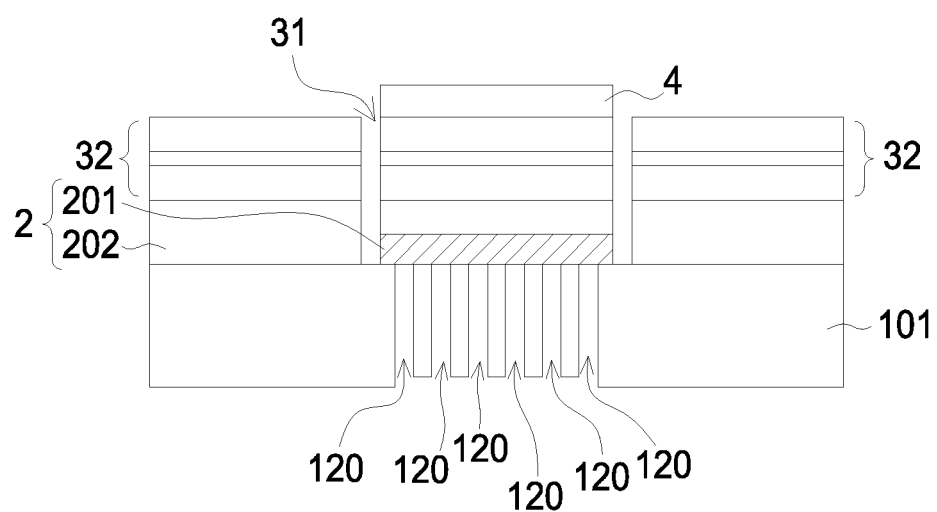
Figure 7D:
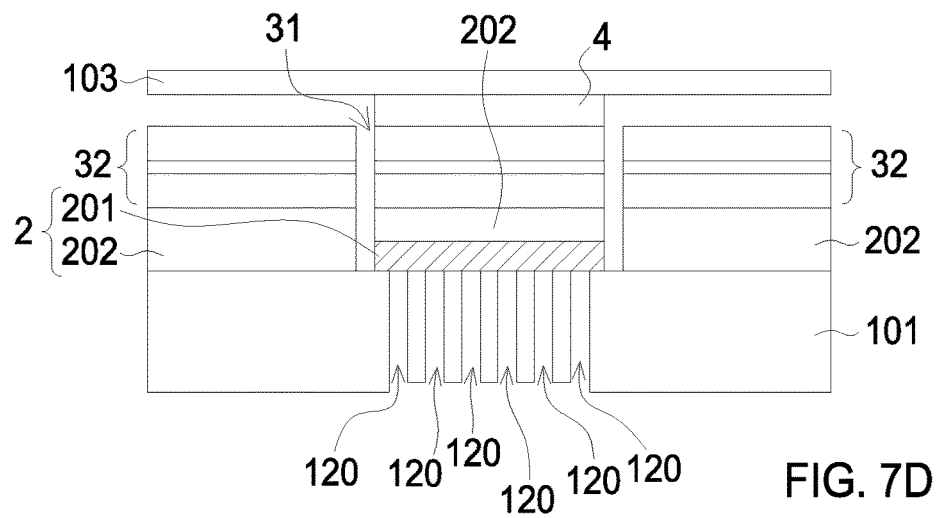
Figure 7E:
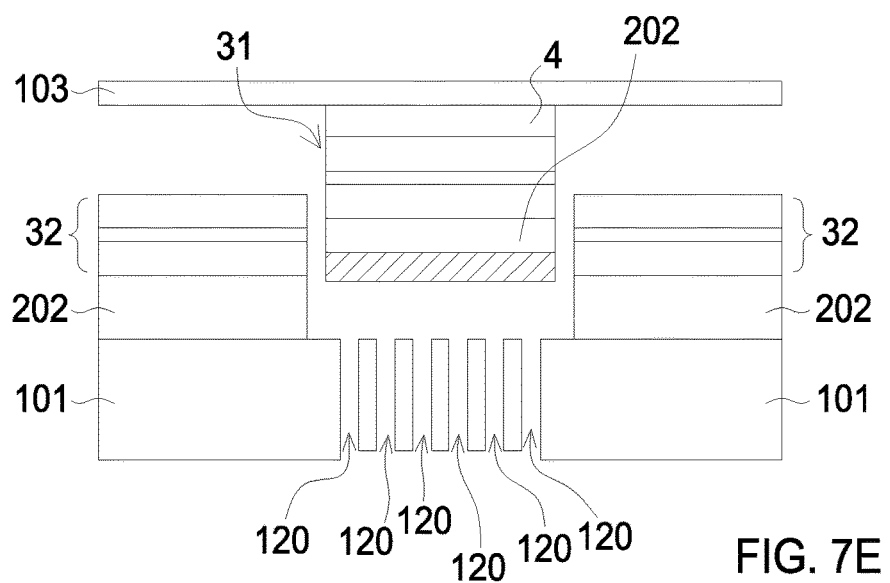
Figure 7F:
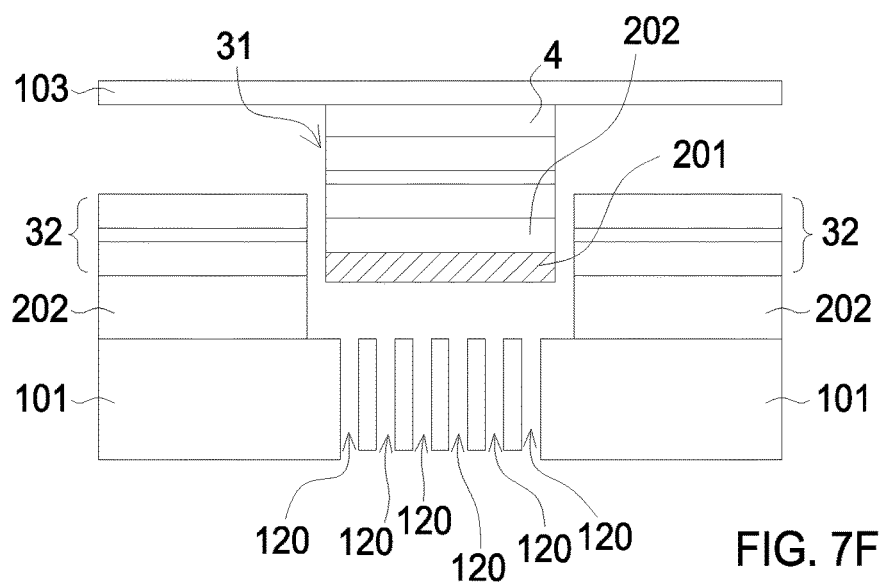
Figure 8A:
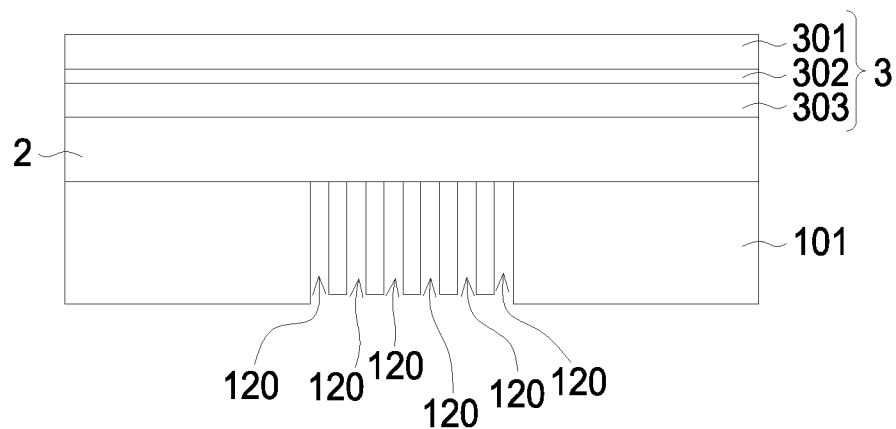
FIGS. 8A to 8F show the structures corresponding to the steps of a manufacturing process according to the eighth embodiment.
Figure 8B:
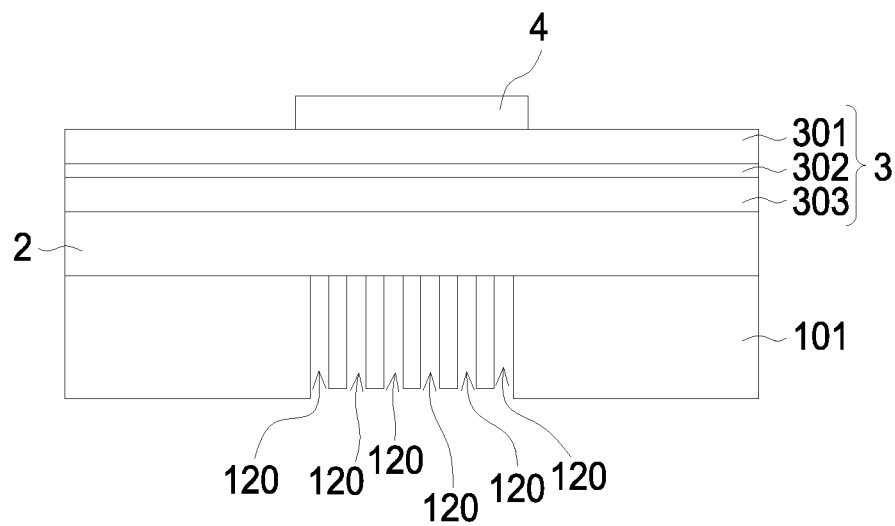
Figure 8C:
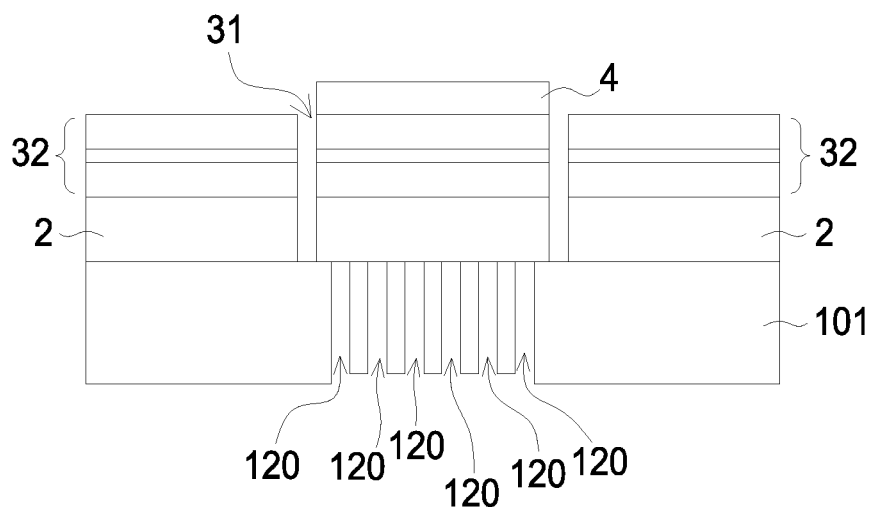
Figure 8D:
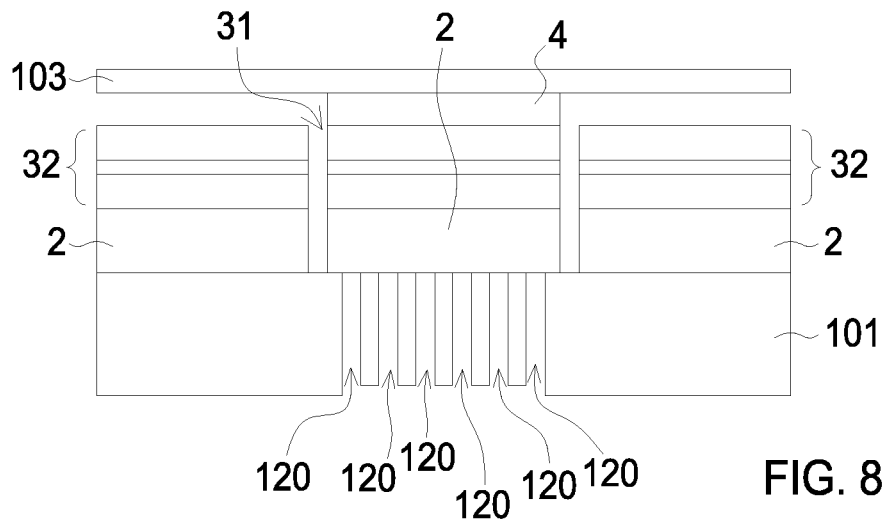
Figure 8E:
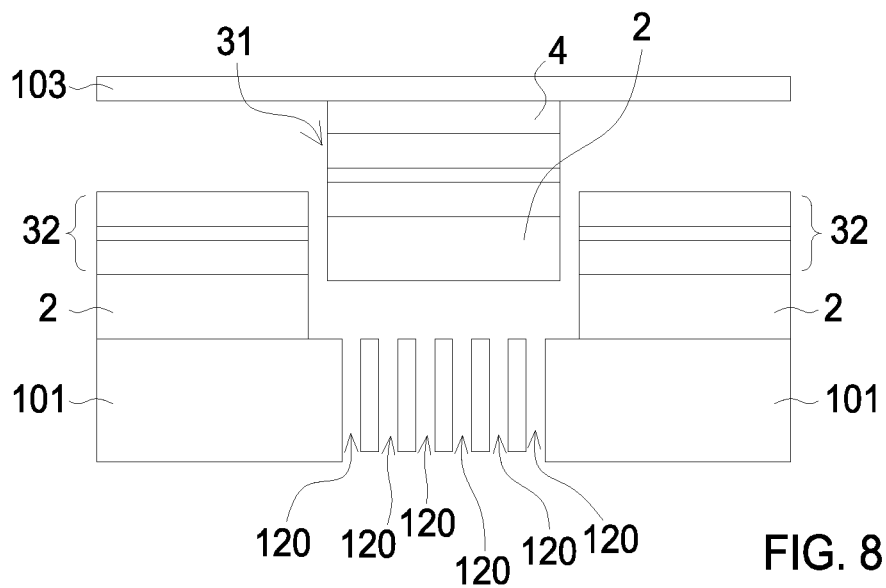
Figure 8F:
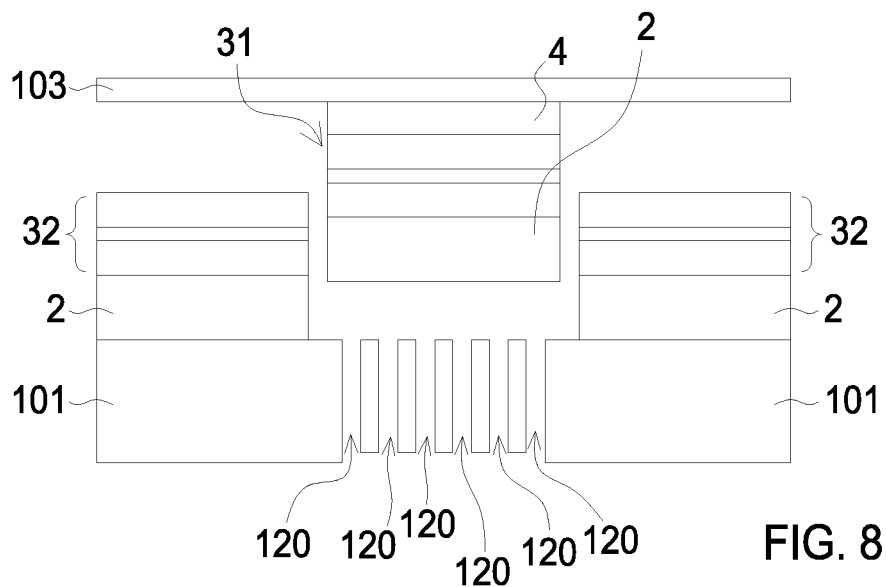

In the next step, as shown in FIG. 6H, when the material of the support structure 5 is metal such as Ti, Al, TiW and Ag, or the material containing Si, such as $SiO_x$, $SiN_x$ and poly-Si, the support structure 5 can be removed by wet etching or vapor etching, and, then, the forces in the opposite directions are directly applied on the picking unit 103 and the adhesion substrate 101 respectively to separate the first semiconductor epitaxial stack 31 and the sacrificial layer 201. In this embodiment, the etchant used in the wet etching process comprises hydrofluoric (HF) acid, and the chemical material used in the vapor etching process comprises hydrofluoric (HF) vapor. When the material of the support structure 5 is UV dissociated material comprising acrylic acid, unsaturated polyester, epoxy, oxetane or vinyl ether, the adhesion between the support structure 5 and the adhesion structure 2 can be reduced or disappears by using UV light to irradiate the support structure 5, and, then, the forces in the opposite directions are directly applied on the picking unit 103 and the adhesion substrate 101 respectively to separate the first semiconductor epitaxial stack 31 and the support structure 5. When the material of the support structure 5 is thermoplastic comprising nylon, PP, PBT, PPO, PC, ABS or PVC, the adhesion between the support structure 5 and the adhesion structure 2 can be reduced or disappears by heating the support structure 5, and, then, the forces in the opposite directions are directly applied on the picking unit 103 and the adhesion substrate 101 respectively to separate the first semiconductor epitaxial stack 31 and the support structure 5.

In another embodiment, as mentioned above, the picking unit 103 comprises the flexible substrate 1032 and the supporting structure 1031. After the first semiconductor epitaxial stack 31 is separated from the sacrificial layer 201, the flexible substrate 1032 and the supporting structure 1031 are able to be separated to form a flexible display, as shown in FIG. 11B.

Seventh Embodiment

FIGS. 7A to 7F show the structures corresponding to the steps of a manufacturing process according to the seventh embodiment. The difference between this embodiment and the second embodiment is that the adhesion substrate 101 comprises multiple holes 120 corresponding to each first semiconductor epitaxial stack 31 so that the adhesion between the first semiconductor epitaxial stack 31 and the adhesion substrate 101 in this embodiment is lower than the adhesion between the first semiconductor epitaxial stack 31 and the adhesion substrate 101 in the second embodiment. Therefore, it is easier to separate the first semiconductor epitaxial stack 31 from the adhesion substrate 101 by using mechanical force. Or when the sacrificial layer 201 is removed by wet etching or vapor etching, it needs less time for the etchant comprising hydrofluoric (HF) acid or the chemical material comprising hydrofluoric (HF) vapor to etch the sacrificial layer 201 through the multiple holes 120.

Eighth Embodiment

FIGS. 8A to 8F show the structures corresponding to the steps of a manufacturing process according to the eighth embodiment. The difference between this embodiment and the seventh embodiment is there is no sacrificial layer in the adhesion structure 2 in this embodiment. The adhesion between the first semiconductor epitaxial stack 31 and the adhesion substrate 101 in this embodiment is lower than the adhesion between the first semiconductor epitaxial stack 31 and the adhesion substrate 101, and the first semiconductor epitaxial stack 31 can be separated from the adhesion substrate 101 by using mechanical force.

Ninth Embodiment

Figure 9A:
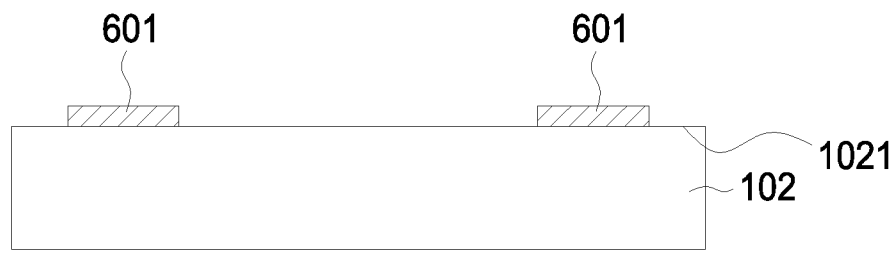
FIGS. 9A to 9I show the structures corresponding to the steps of a manufacturing process according to the ninth embodiment.

FIGS. 9A to 9I show the structures corresponding to the steps of a manufacturing process according to the ninth embodiment. As shown in FIG. 9A, a growth substrate 102 having a surface 1021 is provided, wherein the surface 1021 is used for growing a semiconductor epitaxial stack thereon in following processes. The material of the growth substrate 102 comprises Ge, GaAs, InP, GaP, sapphire, SiC, Si, LiAlO$_2$, ZnO, GaN, AlN or the combination thereof. A patterned sacrificial layer 601 is formed on the surface 1021 of the growth substrate 102, wherein the material of the sacrificial layer 601 comprises semiconductor such as AlAs and AlN, or oxide such as SiO$_x$. When the material of the sacrificial layer 601 is semiconductor, the patterned sacrificial layer 601 is formed by Metalorganic Chemical Vapor Deposition (MOCVD) and etching process to pattern the sacrificial layer 601. When the material of the sacrificial layer 601 is oxide, the patterned sacrificial layer 601 is formed by Physical Vapor Deposition (PVD) or Chemical Vapor Deposition (CVD) and etching process to pattern the sacrificial layer 601.

Figure 9B:
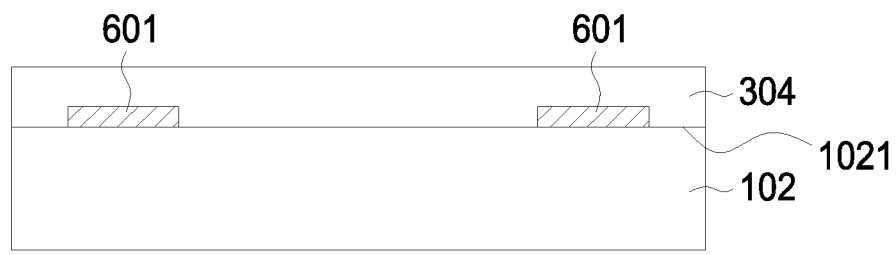

In the next step, as shown in FIG. 9B, a semiconductor layer 304 is formed on the surface 1021 of the growth substrate 102 and covers the sacrificial layer 601, wherein the material of the semiconductor layer 304 is different from the material of the sacrificial layer 601. The semiconductor layer 304 comprises a buffer layer (not shown) or a window layer (not shown). The buffer layer is between the growth substrate 102 and the window layer or between the growth substrate 102 and a semiconductor epitaxial stack 3 which is formed in the following processes. In the structure of light-emitting diode, the buffer layer is used for reducing the lattice mismatch between two layers made of different materials. On the other hand, the buffer layer comprises single layer, multiple layers, a combination of two kinds of materials or two separated structures, wherein the material of the buffer layer comprises organic metal, inorganic metal or semiconductor. The buffer layer is able to be used as a reflective layer, thermally conductive layer, electrically-conductive layer, ohmic-contact layer, anti-deformation layer, stress release layer, stress adjusting layer, bonding layer, wavelength converter layer or fixed structure. The window layer is a semiconductor layer with larger thickness for increasing the light extracting efficiency of the semiconductor epitaxial stack 3 and promoting the electrical current lateral spreading, wherein the material of the window layer comprises Al, Ga, In, As, P, N or combination thereof, such as GaN and AlGaInP.

Figure 9C:

In the next step, as shown in FIG. 9C, the semiconductor epitaxial stack 3 is formed on the semiconductor layer 304. The semiconductor epitaxial stack 3 comprises a first semiconductor layer 301 having a first type conductivity, a converting unit 302 and a second semiconductor layer 303 having a second type conductivity sequentially formed on the growth substrate 102. The first semiconductor layer 301 and the second semiconductor layer 303 both are single-layer structure or multi-layer structure (multi-layer means two or more than two layers). The first semiconductor layer 301 and the second semiconductor layer 303 have different conductive types, different electrical types and different polarities, or are doped with different elements for providing electrons or holes. When the first semiconductor layer 301 is p-type semiconductor, the second semiconductor layer 303 is n-type semiconductor, of which the electrical type is different from that of the p-type semiconductor. On the contrary, when the first semiconductor layer 301 is n-type semiconductor, the second semiconductor layer 303 is p-type semiconductor. The converting unit 302 is formed between the first semiconductor layer 301 and the second semiconductor layer 303. The converting unit 302 is able to mutually convert light into electrical power or electrical power into light. The semiconductor epitaxial stack 3 can be further adopted in a semiconductor device, equipment, product or circuit for mutually converting light into electrical power or electrical power into light. Specifically, the semiconductor epitaxial stack 3 can further form a light-emitting diode (LED), a laser diode (LD), a solar cell or be adopted in a display. Taking the light-emitting diode (LED) as an example, the wavelength of the light emitted can be adjusted by adjusting the combination of one layer or multiple layers of the semiconductor epitaxial stack 3. The material of the semiconductor epitaxial stack 3 comprises aluminum gallium indium phosphide (AlGaInP) series, aluminum gallium indium nitride (AlGaInN) series, or zinc oxide (ZnO) series. The structure of the converting unit 302 comprises single heterostructure (SH), double heterostructure (DH), double-side double heterostructure (DDH) or multi-quantum well (MQW). Specifically, the converting unit 302 can be intrinsic, p-type or n-type semiconductor. When an electrical current passes through the semiconductor epitaxial stack 3, the converting unit 302 is able to emit a light. As the converting unit 302 is made of aluminum gallium indium phosphide (AlGaInP) series, the light emitted from the converting unit 302 is amber series such as red, orange and yellow. As the converting unit 302 is made of aluminum gallium indium nitride (AlGaInN) series, the light emitted from the converting unit 302 is blue or green.

Figure 9D:
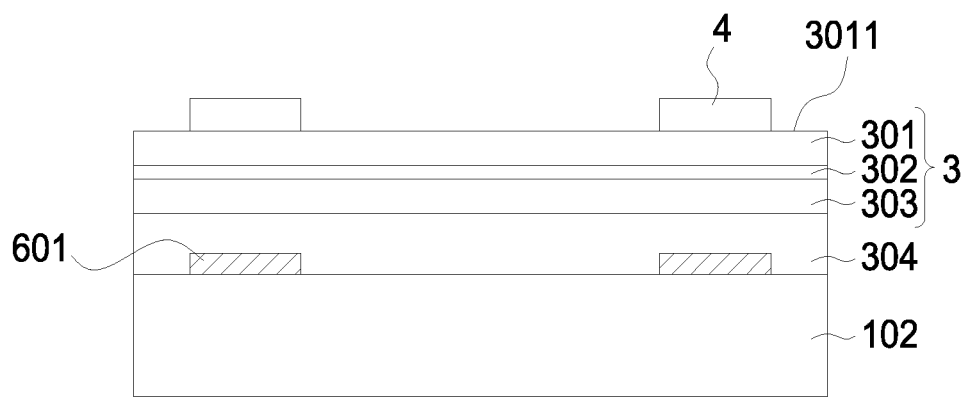

In the next step, as shown in FIG. 9D, a patterned adhesion medium 4 corresponding to the patterned sacrificial layer 601 is formed on the surface 3011 of the semiconductor epitaxial stack 3, wherein the method of forming the patterned adhesion medium 4 comprises forming a layer of adhesion medium layer on the surface 3011 and, then, using photolithography method or etching method to pattern the layer of adhesion medium layer to form the patterned adhesion medium 4, wherein the photolithography method and the patterned etching method are generally semiconductor producing processes. The material of the patterned adhesion medium 4 comprises organic material or inorganic material, wherein the organic material comprises acrylic acid, unsaturated polyester, epoxy, oxetane, vinyl ether, nylon, PP, PBT, PPO, PC, ABS, PVC or BCB, and the inorganic material comprises metal such as Ti, Au, Be, W, Al, Ge, Cu and combination thereof; oxide such as ITO, CTO, ATO, IZO, AZO, ZTO, ZnO and $SiO_x$; or nitride such as $SiN_x$.

Figure 9E:
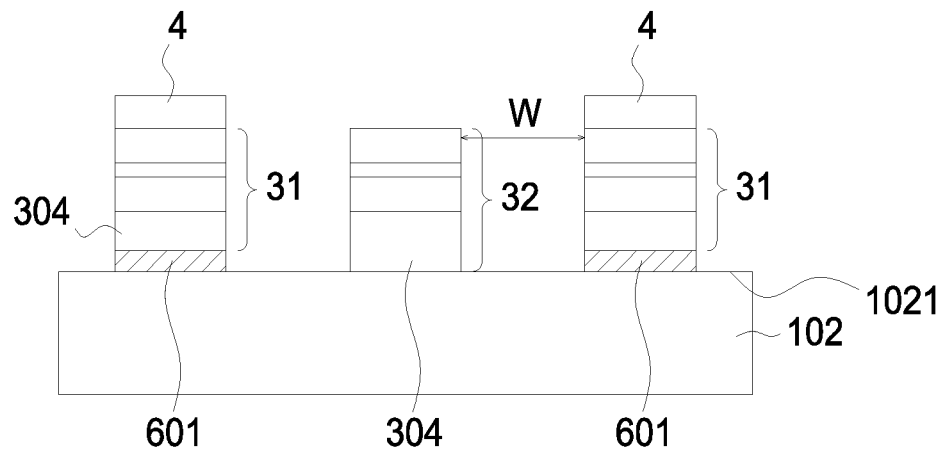

In the next step, as shown in FIG. 9E, the semiconductor epitaxial stack 3 and the semiconductor layer 304 are patterned to reveal the surface 1011, so a plurality of semiconductor epitaxial stacks is formed, wherein the multiple semiconductor epitaxial stacks are separated. The multiple semiconductor epitaxial stacks comprise a first semiconductor epitaxial stack 31 and a second semiconductor epitaxial stack 32, wherein the first semiconductor epitaxial stack 31 has the adhesion medium 4 thereon and the second semiconductor epitaxial stack 32 does not have the adhesion medium 4 on the surface 3011. The method of patterning the semiconductor epitaxial stack 3 and the adhesion structure 2 comprises wet etching or dry etching. In this embodiment, dry etching method is applied to make an interval w between the first semiconductor epitaxial stack 31 and the second semiconductor epitaxial stack 32 as small as possible to prevent epitaxial stack of the semiconductor epitaxial stack 3 from being removed excessively. In this embodiment, the interval w is between 1 μm and 10 μm, or preferably about 5 μm. In this embodiment, the sacrificial layer 601 is between the first semiconductor epitaxial stack 31 and the growth substrate 102 and the second semiconductor epitaxial stack 32 is directly formed on the growth substrate 102, so the adhesion between the semiconductor layer 304 and the sacrificial layer 601 can be smaller than the adhesion between the semiconductor layer 304 and the growth substrate 102 by controlling the processing condition of forming the semiconductor layer 304 or by applying different materials for the sacrificial layer 601 and the semiconductor layer 304, wherein the material of the sacrificial layer 601 comprises oxide.

Figure 9F:
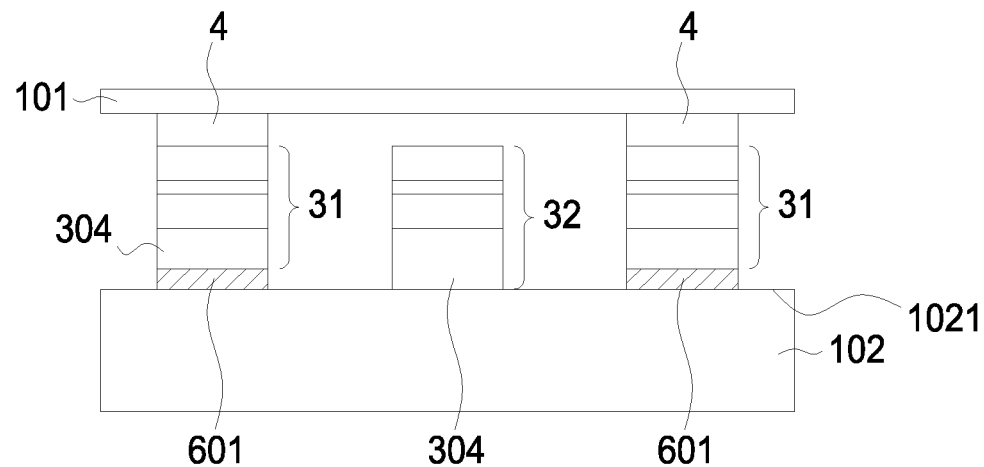

In the next step, as shown in FIG. 9F, a picking unit 103 is provided to stick the adhesion medium 4 by heating, pressing or using stickiness of the picking unit 103. The picking unit 103 comprises electrically-conductive material such as electrically-conductive substrate and printed circuit board, wherein the electrically-conductive substrate comprises semiconductor such as Si, GaAs, SiC, GaN, AlN; oxide such as ZnO; metal or the combination thereof, and the printed circuit board comprises single-sided printed circuit board, double-sided printed circuit board, multilayers printed circuit board or flexible printed circuit board; or electrically-insulated material such as sapphire, diamond, glass, quartz, acryl, $LiAlO_2$, ceramics, and EPS tape.

In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN) or polyimide (PI), and the supporting structure 1031 comprises hard substrate such as sapphire, diamond, glass, quartz, and acryl for supporting the flexible substrate 1032.

In another embodiment, the patterned adhesion medium 4 is able to be formed on the picking unit 103 in advance. Then, the alignment bonding technology is applied to align the adhesion medium 4 and the first semiconductor epitaxial stack 31 firstly and, then, bond the adhesion medium 4 and the first semiconductor epitaxial stack 31 by heating and pressing.

Figure 9G:
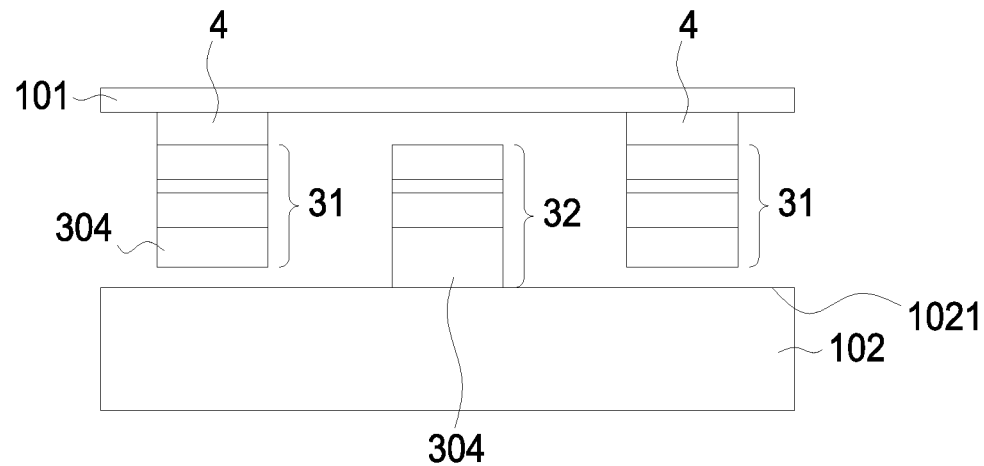
Figure 9H:
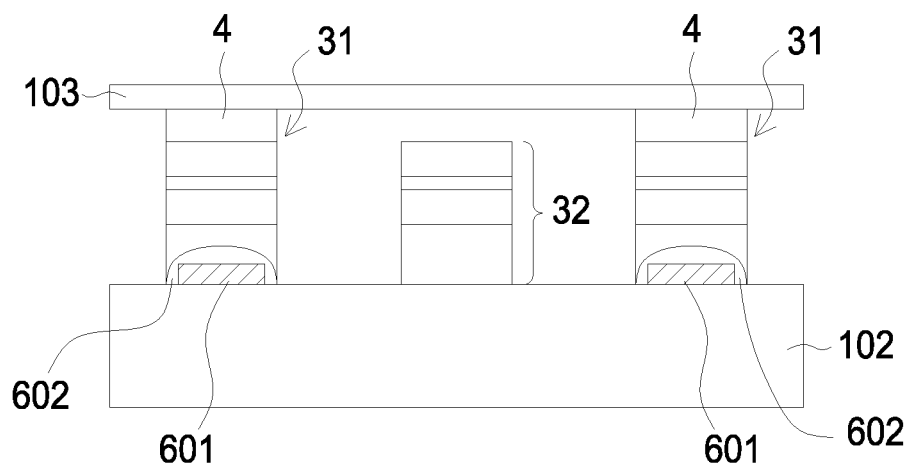
Figure 9I:
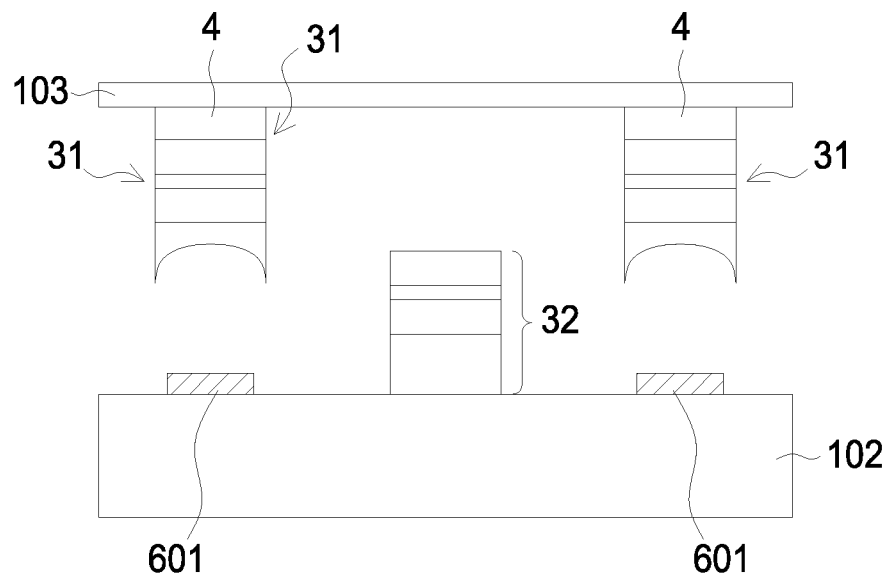

In the next step, as shown in FIG. 9G, when the sacrificial layer 601 is made of $SiO_x$ or AlAs, the sacrificial layer 601 can be removed by wet etching or vapor etching, and then the forces in the opposite directions are directly applied on the picking unit 103 and the growth substrate 102 respectively to separate the first semiconductor epitaxial stack 31 and the sacrificial layer 601. In this embodiment, the etchant used in the wet etching process comprises hydrofluoric (HF) acid, and the chemical material used in the vapor etching process comprises hydrofluoric (HF) vapor. In another embodiment, as shown in FIGS. 9H and 9I, when the sacrificial layer 601 is not made of semiconductor such as $SiO_x$, a pore 602 between the semiconductor layer 304 and the sacrificial layer 601, which decreases the contact area between the semiconductor layer 304 and the sacrificial layer 601, can be formed by controlling the temperature and pressure in the phase of lateral epitaxial growth during epitaxial growth of the semiconductor layer 304. Then, the forces in the opposite directions can be directly applied on the picking unit 103 and the growth substrate 102 respectively to directly separate the first semiconductor epitaxial stack 31 and the sacrificial layer 601.

In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN) or polyimide (PI), and the supporting structure 1031 comprises hard substrate such as sapphire, diamond, glass, quartz and acryl, for supporting the flexible substrate 1032.

Tenth Embodiment

Figure 10A:
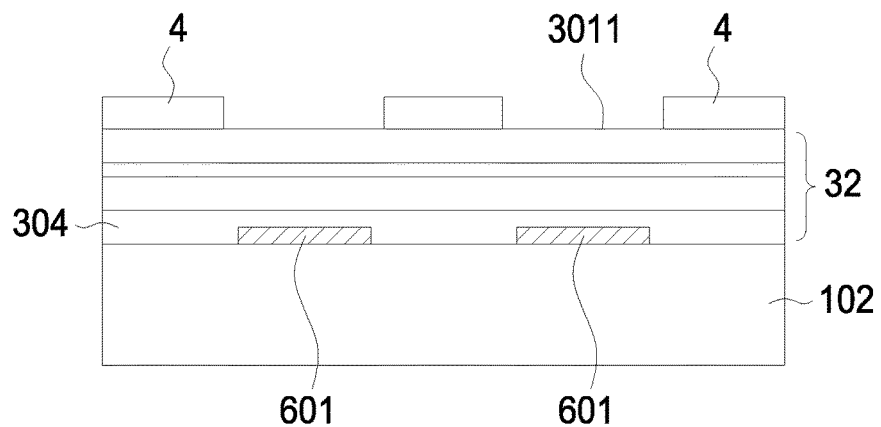
FIGS. 10A to 10C show the structures corresponding to the steps of a manufacturing process according to the tenth embodiment.
Figure 10B:
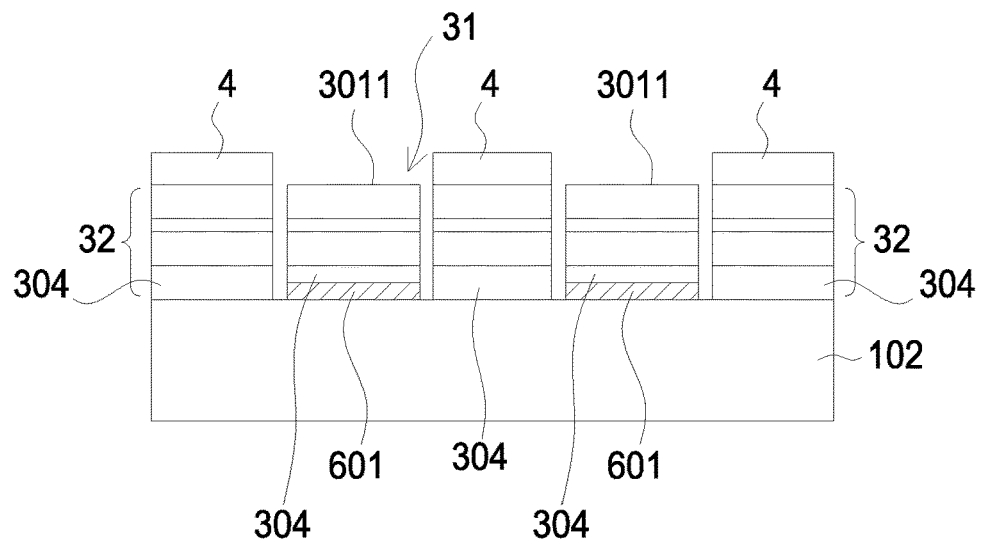
Figure 10C:
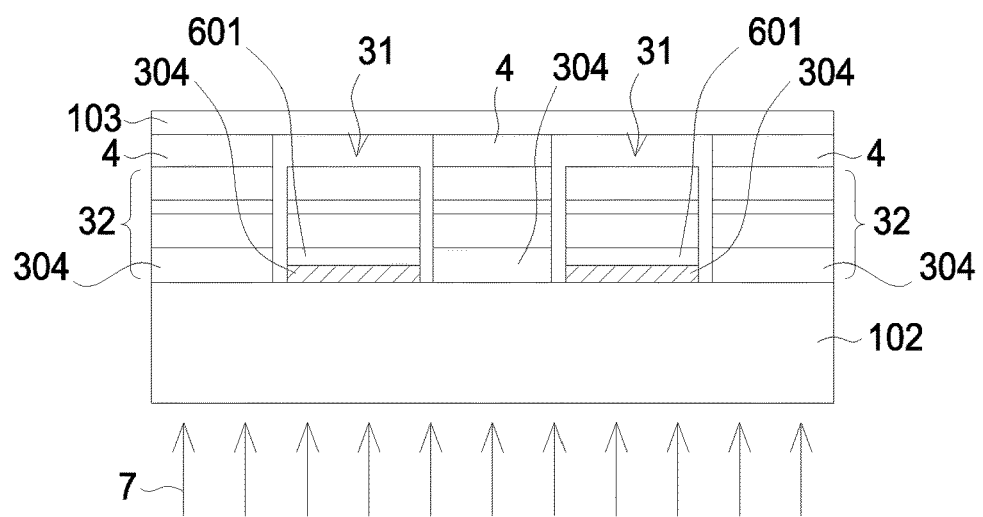

FIGS. 10A to 10C show the structures corresponding to the steps of a manufacturing process according to the tenth embodiment. The difference between the tenth embodiment and the ninth embodiment is that the adhesion medium 4 is on the second semiconductor epitaxial stack 32 and the first semiconductor epitaxial stack 31 exposes the surface 3011. As shown in FIG. 10C, when the semiconductor layer 304 is made of GaN, the sacrificial layer 601 is made of AlN and the growth substrate 102 is a transparent substrate, a laser 7 can irradiate on the semiconductor layer 304 and the sacrificial layer 601 from a surface 1022 of the growth substrate 102 opposite to the semiconductor layer 304 and the sacrificial layer 601 for separating the semiconductor layer 304 of the second semiconductor epitaxial stack 32 from the growth substrate 102, wherein the energy of the laser 7 is larger than the bandgap of GaN and smaller than the bandgap of AlN. Then, the forces in the opposite directions can be directly applied on the picking unit 103 and the growth substrate 102 respectively to directly separate the second semiconductor epitaxial stack 32 from the growth substrate 102.

Although the present application has been explained above, it is not the limitation of the range, the sequence in practice, the material in practice, or the method in practice. Any modification or decoration for present application is not detached from the spirit and the range of such.

What is claimed is:

1. A semiconductor device, comprising:
   a substrate;
   a first semiconductor unit on the substrate; and
   a first adhesion structure between the substrate and the first semiconductor unit,
   wherein the first adhesion structure comprises an adhesion layer and a sacrificial layer, the adhesion layer directly contacts the first semiconductor unit with a first area, the sacrificial layer directly contacts the first semiconductor unit with a second area, the first area is larger than the second area.

2. The semiconductor device according to claim 1, wherein an adhesion between the adhesion layer and the first semiconductor unit is larger than an adhesion between the sacrificial layer and the first semiconductor unit.

3. The semiconductor device according to claim 1, wherein the substrate only contacts the adhesion layer.

4. The semiconductor device according to claim 1, wherein the first semiconductor unit has a lower surface contacting the sacrificial layer, and the sacrificial layer comprises a pattern and exposes a portion of the lower surface.

5. The semiconductor device according to claim 1, wherein the adhesion layer comprises BCB.

6. The semiconductor device according to claim 1, wherein the sacrificial layer comprises $SiO_x$ or $SiN_x$.

7. The semiconductor device according to claim 1, wherein a thickness of the first adhesion structure is between 1 μm and 10 μm.

8. The semiconductor device according to claim 1, wherein the substrate comprises sapphire, diamond, glass, quartz, acryl, ZnO, $LiAlO_2$, ceramics, GaAs, SiC, GaN, AlN, metal, EPS tape or Si.

9. The semiconductor device according to claim 1, wherein the first semiconductor unit comprises a semiconductor epitaxial stack.

10. The semiconductor device according to claim 9, wherein the semiconductor epitaxial stack comprises a p-type semiconductor, a n-type semiconductor and a converting unit arranged between the p-type semiconductor and the n-type semiconductor.

11. The semiconductor device according to claim 10, wherein the converting unit is made of aluminum gallium indium phosphide (AlGaInP) series or aluminum gallium indium nitride (AlGaInN) series.

12. The semiconductor device according to claim 9, wherein the semiconductor epitaxial stack comprises an upper surface arranged on a side opposite to the substrate, the upper surface is exposed.

13. The semiconductor device according to claim 1, wherein the sacrificial layer comprises UV dissociated material or thermoplastic material.

14. The semiconductor device according to claim 1, further comprising a second semiconductor unit on the substrate, wherein the second semiconductor unit and the first semiconductor unit are separated to each other, and comprise a same structure, a same material composition, or both.

15. The semiconductor device according to claim 14, further comprising an interval between the second semiconductor unit and the first semiconductor unit, and the interval is between 1 μm and 10 μm.

16. The semiconductor device according to claim 14, further comprising a second adhesion structure between the second semiconductor unit and the substrate, wherein the second adhesion structure and the first adhesion structure comprise a same structure, a same material composition, or both.

17. The semiconductor device according to claim 1, wherein the adhesion layer and the sacrificial layer are made of different materials.

18. The semiconductor device according to claim 1, wherein the substrate contacts the sacrificial layer and the adhesion layer.

19. The semiconductor device according to claim 1, wherein the sacrificial layer and the adhesion layer have different cross sectional shapes.

* * * * *